US012568850B2

(12) United States Patent
Watanabe et al.

(10) Patent No.: US 12,568,850 B2
(45) Date of Patent: Mar. 3, 2026

(54) QUANTUM DEVICE

(71) Applicant: NEC Corporation, Tokyo (JP)

(72) Inventors: Suguru Watanabe, Tokyo (JP);
Kunihiko Ishihara, Tokyo (JP);
Katsumi Kikuchi, Tokyo (JP)

(73) Assignee: NEC CORPORATION, Tokyo (JP)

( * ) Notice: Subject to any disclaimer, the term of this
patent is extended or adjusted under 35
U.S.C. 154(b) by 377 days.

(21) Appl. No.: 18/239,447

(22) Filed: Aug. 29, 2023

(65) Prior Publication Data

US 2024/0079281 A1    Mar. 7, 2024

(30) Foreign Application Priority Data

Sep. 2, 2022    (JP) ................................. 2022-139991

(51) Int. Cl.
| | |
|---|---|
| *H01L 23/053* | (2006.01) |
| *H01L 23/498* | (2006.01) |
| *H01R 12/70* | (2011.01) |
| *H01R 12/71* | (2011.01) |
| *H01R 13/24* | (2006.01) |
| *H10N 69/00* | (2023.01) |
| *H01L 23/00* | (2006.01) |

(52) U.S. Cl.
CPC ...... *H01L 23/053* (2013.01); *H01L 23/49822*
(2013.01); *H01R 12/7005* (2013.01); *H01R*
*12/714* (2013.01); *H01R 13/2421* (2013.01);
*H10N 69/00* (2023.02); *H01L 24/16*
(2013.01); *H01L 2224/16225* (2013.01)

(58) Field of Classification Search
None
See application file for complete search history.

(56) References Cited

U.S. PATENT DOCUMENTS

| | | | |
|---|---|---|---|
| 10,756,004 B1 * | 8/2020 | Elsherbini | ............... H01L 25/18 |
| 2011/0298487 A1 * | 12/2011 | Katsuma | ........... G01R 31/2889 |
| | | | 324/756.07 |
| 2012/0313659 A1 * | 12/2012 | Hsu | .................... G01R 1/07314 |
| | | | 324/755.05 |
| 2020/0401921 A1 * | 12/2020 | Chow | .................... G06N 10/40 |
| 2021/0399193 A1 | 12/2021 | Nanba et al. | |
| 2021/0399196 A1 * | 12/2021 | Kikuchi | ............... H01R 12/714 |

(Continued)

FOREIGN PATENT DOCUMENTS

| | | |
|---|---|---|
| JP | H10-022021 A | 1/1998 |
| JP | 2002-148306 A | 5/2002 |
| JP | 2011-180019 A | 9/2011 |

(Continued)

*Primary Examiner* — Cory W Eskridge

(74) *Attorney, Agent, or Firm* — Sughrue Mion, PLLC

(57) ABSTRACT

A quantum device includes a quantum chip including a
superconducting quantum circuit; an interposer including
mounting the quantum chip on a first surface thereof; a
housing having openings penetrating from a first surface of
the housing opposing a second surface of the interposer to a
second surface of the housing with probe pins housed in the
opening, a board with a first surface facing the second
surface of the housing; and one or more spacers between the
first surface of the housing and the second surface of the
interposer to ensure a clearance between the first surface of
the housing and the second surface of the interposer facing
the first surface of the housing.

15 Claims, 34 Drawing Sheets

1: QUANTUM DEVICE
50: BOARD
45: OPENING
55: THROUGH VIA
44: PROBE PIN
52: WIRING LAYER ON SECOND SURFACE
54: CONNECTOR
53: SUBSTRATE
51: WIRING LAYER ON FIRST SURFACE
42: SECOND SURFACE
43: HOUSING
40: SOCKET
41: FIRST SURFACE
47: SPACER
20: INTERPOSER
30: HOLDER
22: WIRING LAYER ON SECOND SURFACE
23: SUBSTRATE
21: WIRING LAYER ON FIRST SURFACE
35: FIRST OPENING BOTTOM
24: THROUGH VIA
32: SECOND OPENING
36: SECOND OPENING BOTTOM
10: QUANTUM CHIP
13: SUBSTRATE
12: SECOND SURFACE
16: BUMP
11: WIRING LAYER ON FIRST SURFACE

(56)                    References Cited

U.S. PATENT DOCUMENTS

2023/0197539  A1*    6/2023   Abraham  .............. H01L 23/049
                                                                257/668

FOREIGN PATENT DOCUMENTS

| | | | |
|---|---|---|---|
| JP | 2011-257227 | A | 12/2011 |
| JP | 2021-072351 | A | 5/2021 |
| JP | 2022-002234 | A | 1/2022 |
| JP | 2022-002237 | A | 1/2022 |

* cited by examiner (a) BOTH-ENDS MOVABLE TYPE PROBE PIN (b) ONE-END MOVABLE TYPE PROBE PIN 44-2: SECOND PLUNGER (FIXED PLUNGER)
44-2a: CONTACT PORTION
44-3: BARREL
44-4: SPRING
44-1: FIRST PLUNGER
44-5: CAVITY
44-1b: SLIDING PORTION
44-1a: CONTACT PORTION 44-2: SECOND PLUNGER
44-2a: CONTACT PORTION
44-2b: SLIDING PORTION
44-3: BARREL
44-4: SPRING
44-1: FIRST PLUNGER
44-5: CAVITY
44-1b: SLIDING PORTION
44-1a: CONTACT PORTION

53: SUBSTRATE

42: SECOND SURFACE

43: HOUSING

41: FIRST SURFACE

50: BOARD

55: THROUGH VIA 45-1: OPENING

52: WIRING LAYER ON SECOND SURFACE

55A: SIDE WALL CONDUCTIVE LAYER

51: WIRING LAYER ON FIRST SURFACE 45-2: OPENING 44-2: SECOND PLUNGER 44-3: BARREL 44-1: FIRST PLUNGER

47: SPACER

1: QUANTUM DEVICE

FIG. 4

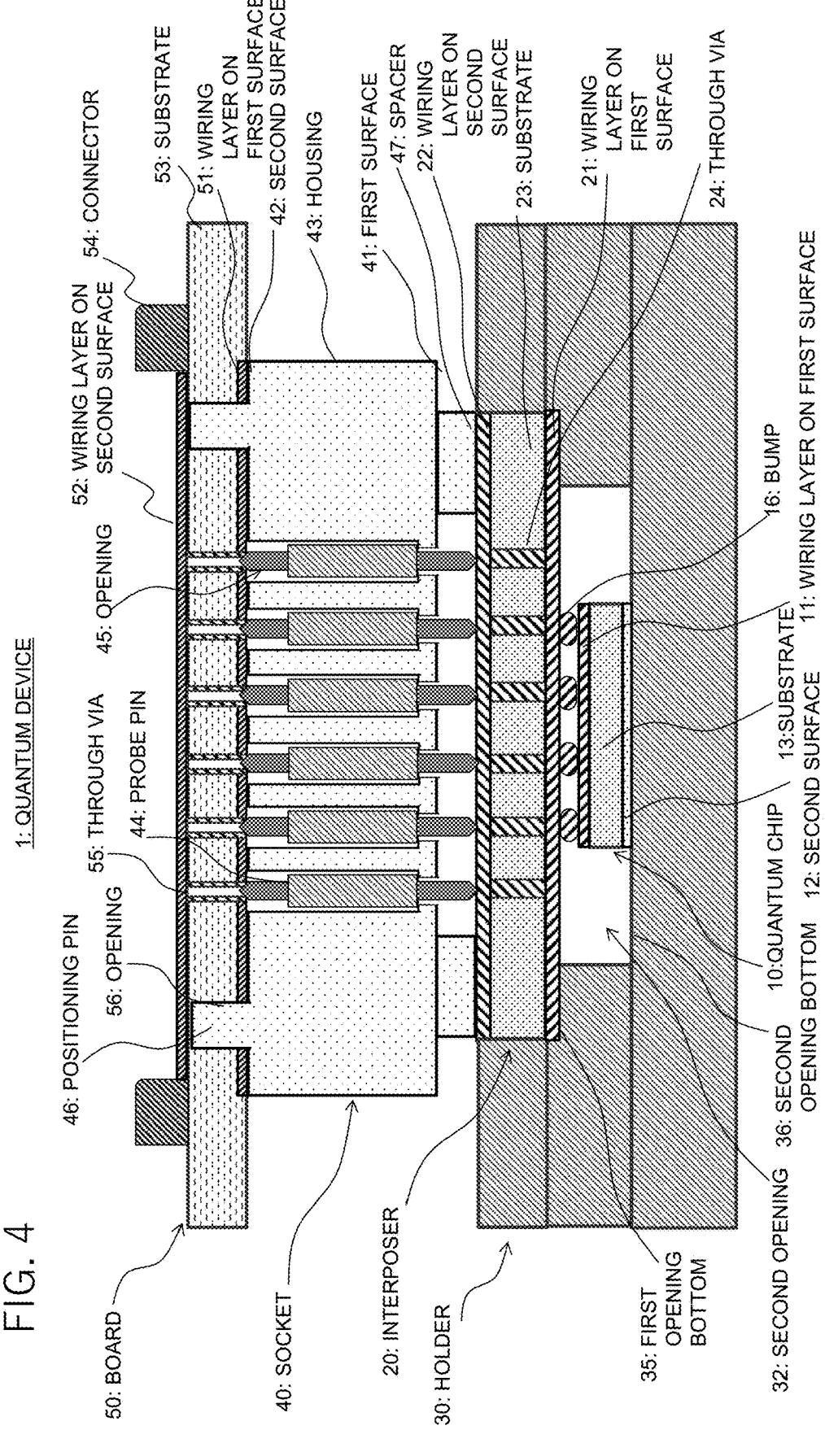

1: QUANTUM DEVICE

50: BOARD
40: SOCKET
20: INTERPOSER
30: HOLDER
35: FIRST OPENING BOTTOM
32: SECOND OPENING

46: POSITIONING PIN
56: OPENING
55: THROUGH VIA
44: PROBE PIN
45: OPENING
52: WIRING LAYER ON SECOND SURFACE
36: SECOND OPENING BOTTOM

54: CONNECTOR
53: SUBSTRATE
51: WIRING LAYER ON FIRST SURFACE
42: SECOND SURFACE
43: HOUSING
41: FIRST SURFACE
47: SPACER
22: WIRING LAYER ON SECOND SURFACE
23: SUBSTRATE
21: WIRING LAYER ON FIRST SURFACE
24: THROUGH VIA
16: BUMP
11: WIRING LAYER ON FIRST SURFACE
13: SUBSTRATE
10: QUANTUM CHIP
12: SECOND SURFACE

FIG. 5A
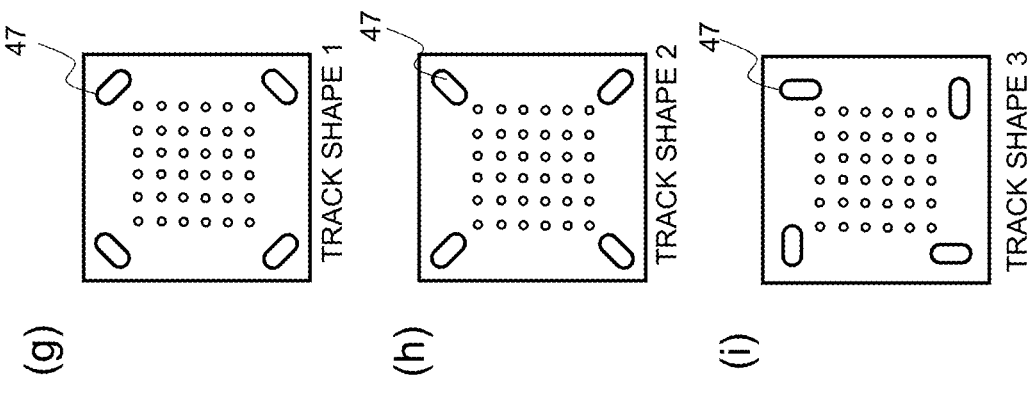
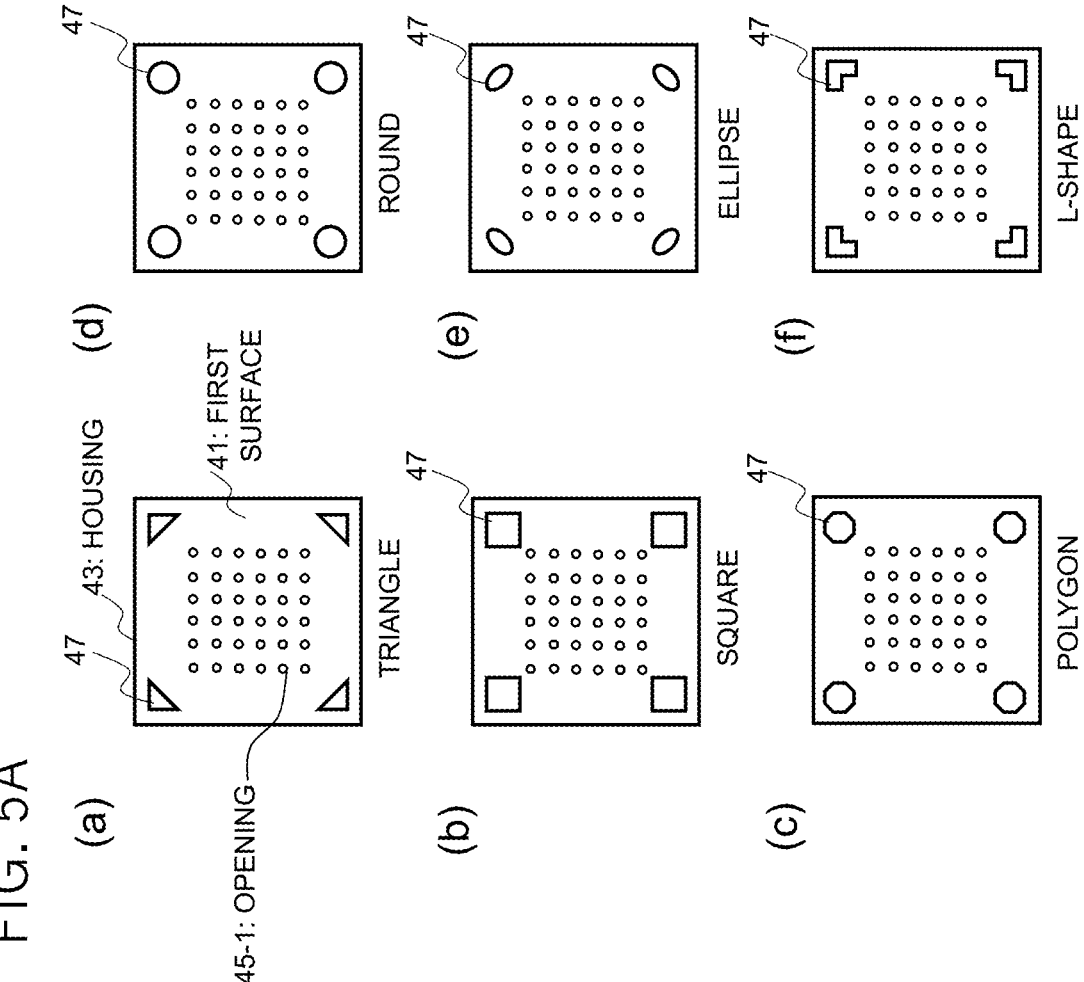

FIG. 7

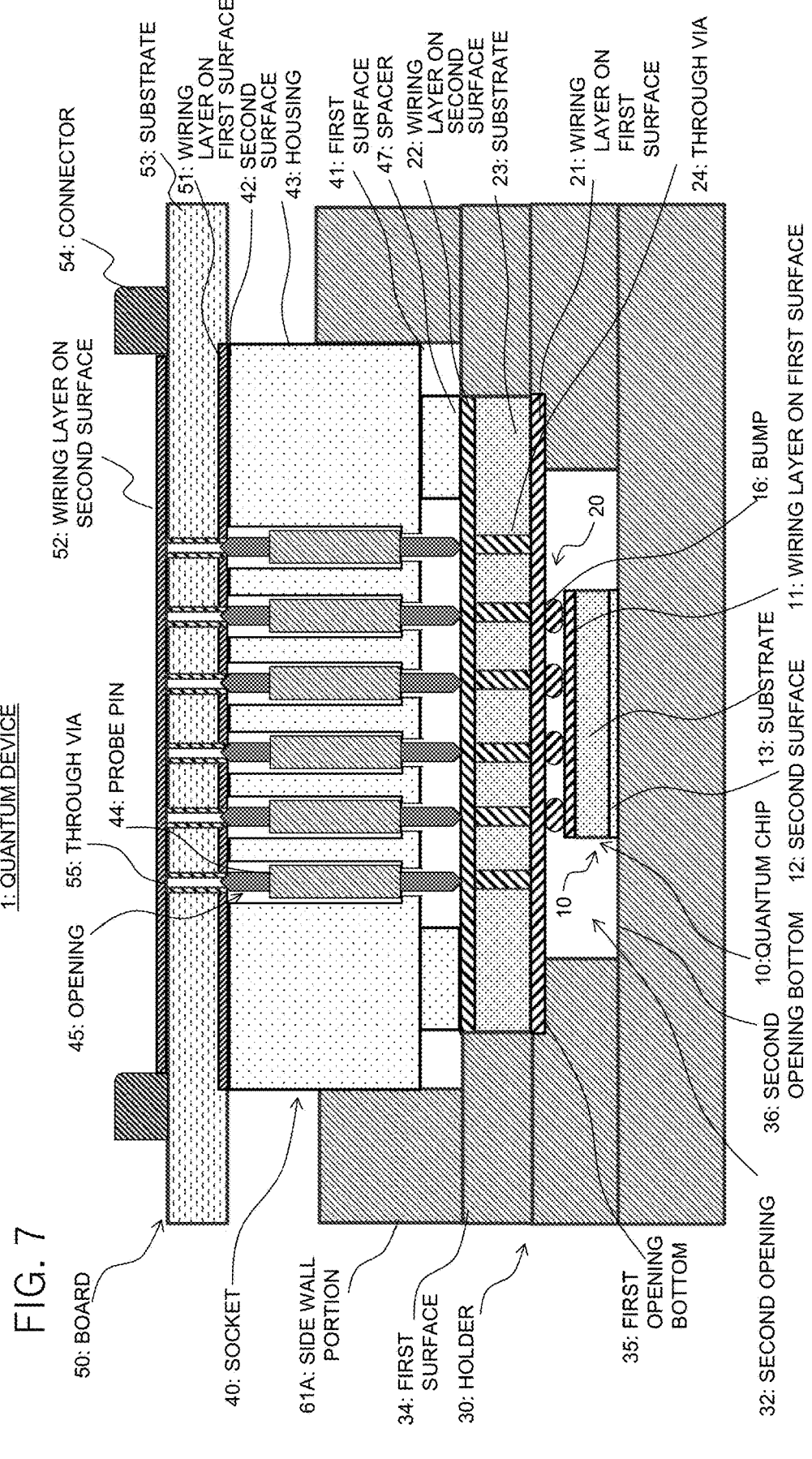

1: QUANTUM DEVICE

54: CONNECTOR
53: SUBSTRATE
51: WIRING LAYER ON FIRST SURFACE
42: SECOND SURFACE
43: HOUSING
41: FIRST SURFACE
47: SPACER
22: WIRING LAYER ON SECOND SURFACE
23: SUBSTRATE
21: WIRING LAYER ON FIRST SURFACE
24: THROUGH VIA

52: WIRING LAYER ON SECOND SURFACE

44: PROBE PIN

45: OPENING
55: THROUGH VIA

16: BUMP
11: WIRING LAYER ON FIRST SURFACE
13: SUBSTRATE
12: SECOND SURFACE
10: QUANTUM CHIP
36: SECOND OPENING BOTTOM

50: BOARD

40: SOCKET

61A: SIDE WALL PORTION

34: FIRST SURFACE

30: HOLDER

35: FIRST OPENING BOTTOM

32: SECOND OPENING

FIG. 8A

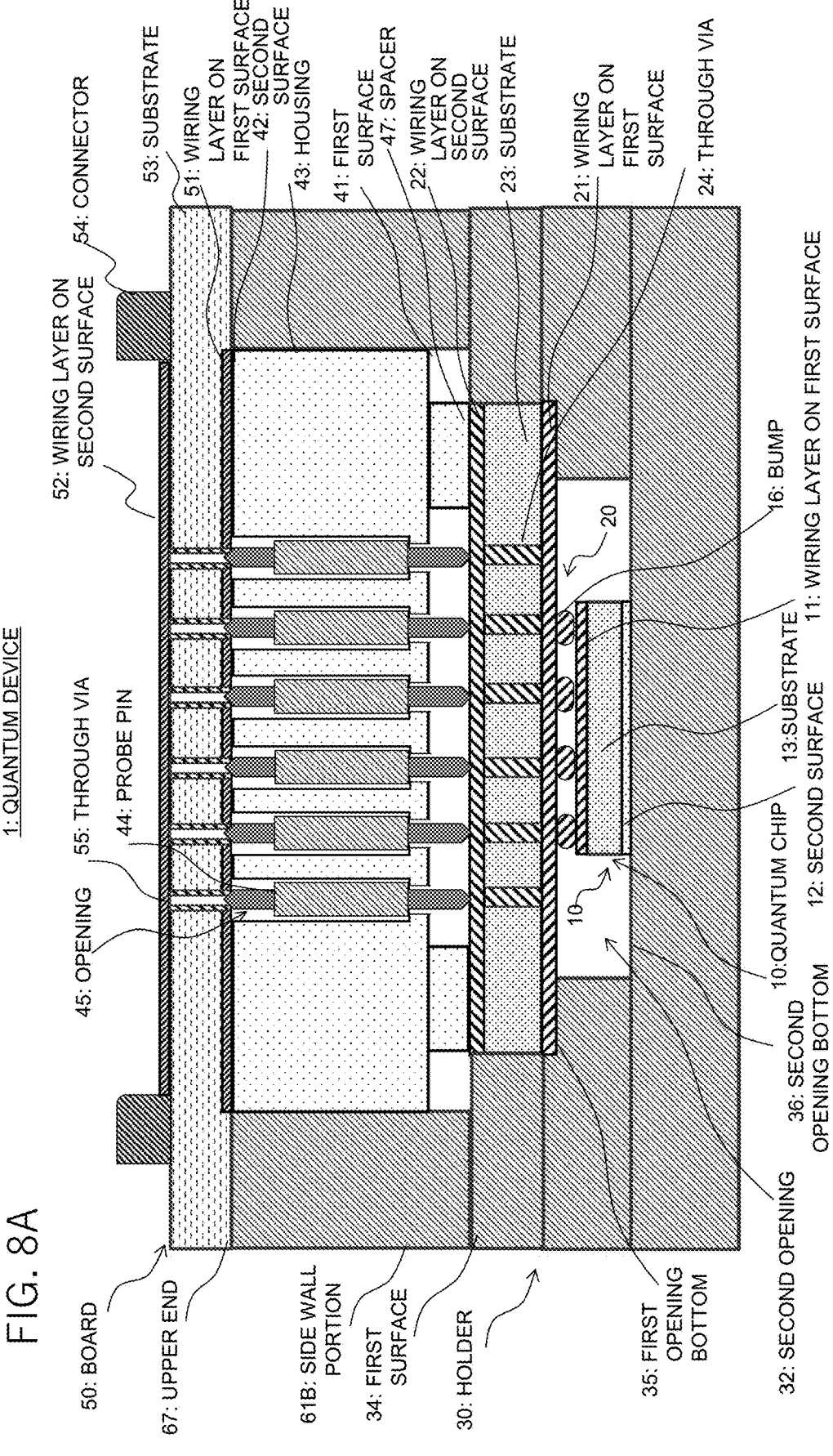

1: QUANTUM DEVICE

54: CONNECTOR
53: SUBSTRATE
51: WIRING LAYER ON FIRST SURFACE
42: SECOND SURFACE
43: HOUSING
41: FIRST SURFACE
47: SPACER
22: WIRING LAYER ON SECOND SURFACE
23: SUBSTRATE
21: WIRING LAYER ON FIRST SURFACE
24: THROUGH VIA

52: WIRING LAYER ON SECOND SURFACE

16: BUMP
20
11: WIRING LAYER ON FIRST SURFACE
13: SUBSTRATE
12: SECOND SURFACE
10: QUANTUM CHIP

50: BOARD
67: UPPER END
55: THROUGH VIA
44: PROBE PIN
45: OPENING
61B: SIDE WALL PORTION
34: FIRST SURFACE
30: HOLDER
35: FIRST OPENING BOTTOM
36: SECOND OPENING BOTTOM
32: SECOND OPENING

32: SECOND OPENING 45-1: OPENING (FIRST SURFACE SIDE)

47: SPACER

67: UPPER END

68: SCREW HOLE

61B: SIDE WALL PORTION

30: HOLDER 45-2: OPENING (SECOND SURFACE SIDE)

44: PROBE PIN

43: HOUSING

20: INTERPOSER

FIG. 8C

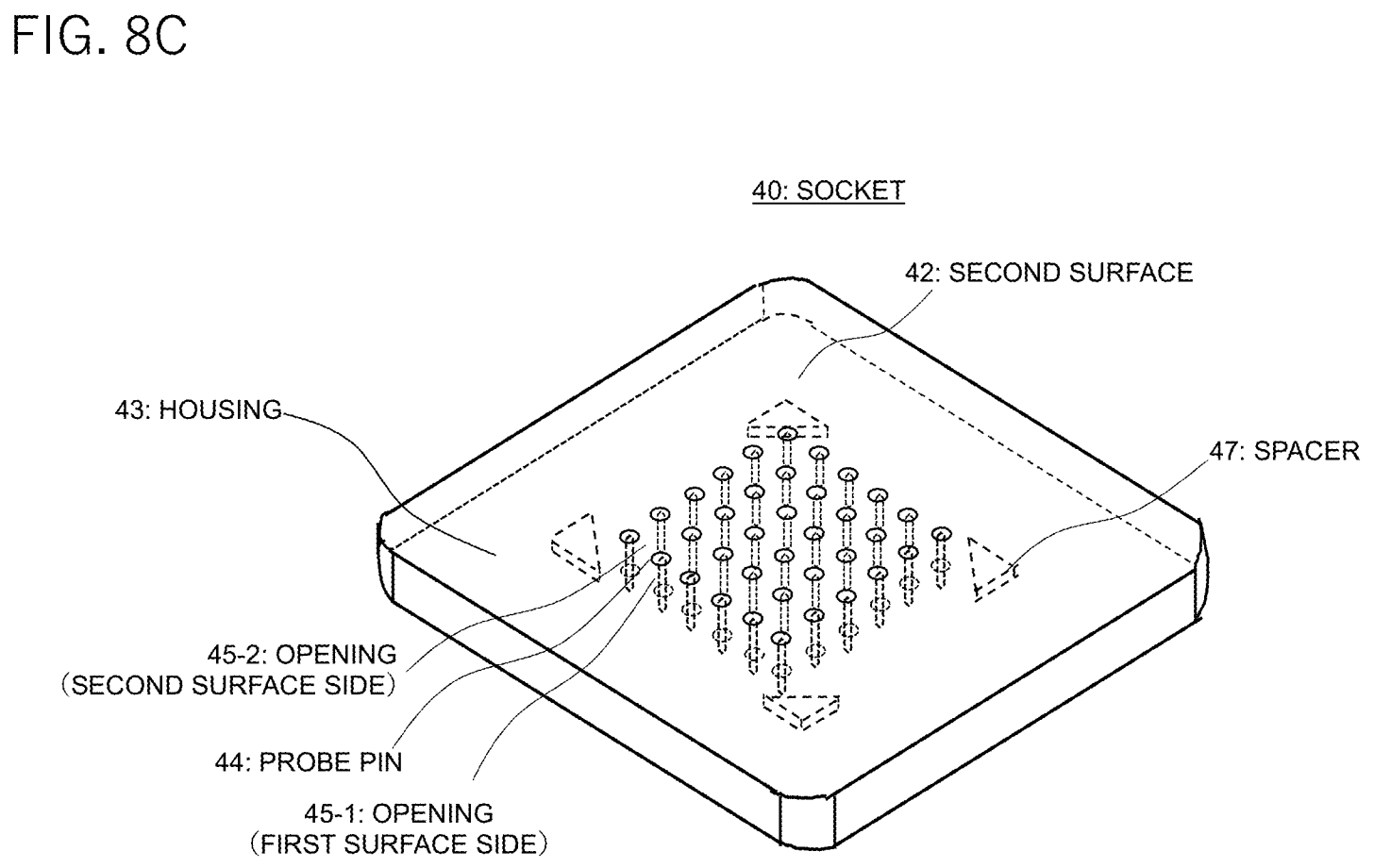

40: SOCKET

42: SECOND SURFACE

47: SPACER

43: HOUSING 45-2: OPENING
(SECOND SURFACE SIDE)

44: PROBE PIN 45-1: OPENING
(FIRST SURFACE SIDE)

67: UPPER END

68: SCREW HOLE

42: SECOND SURFACE 45-2: OPENING
(44: PROBE PIN)

47: SPACER

43: HOUSING

20: INTERPOSER

32: SECOND
OPENING

FIG. 9

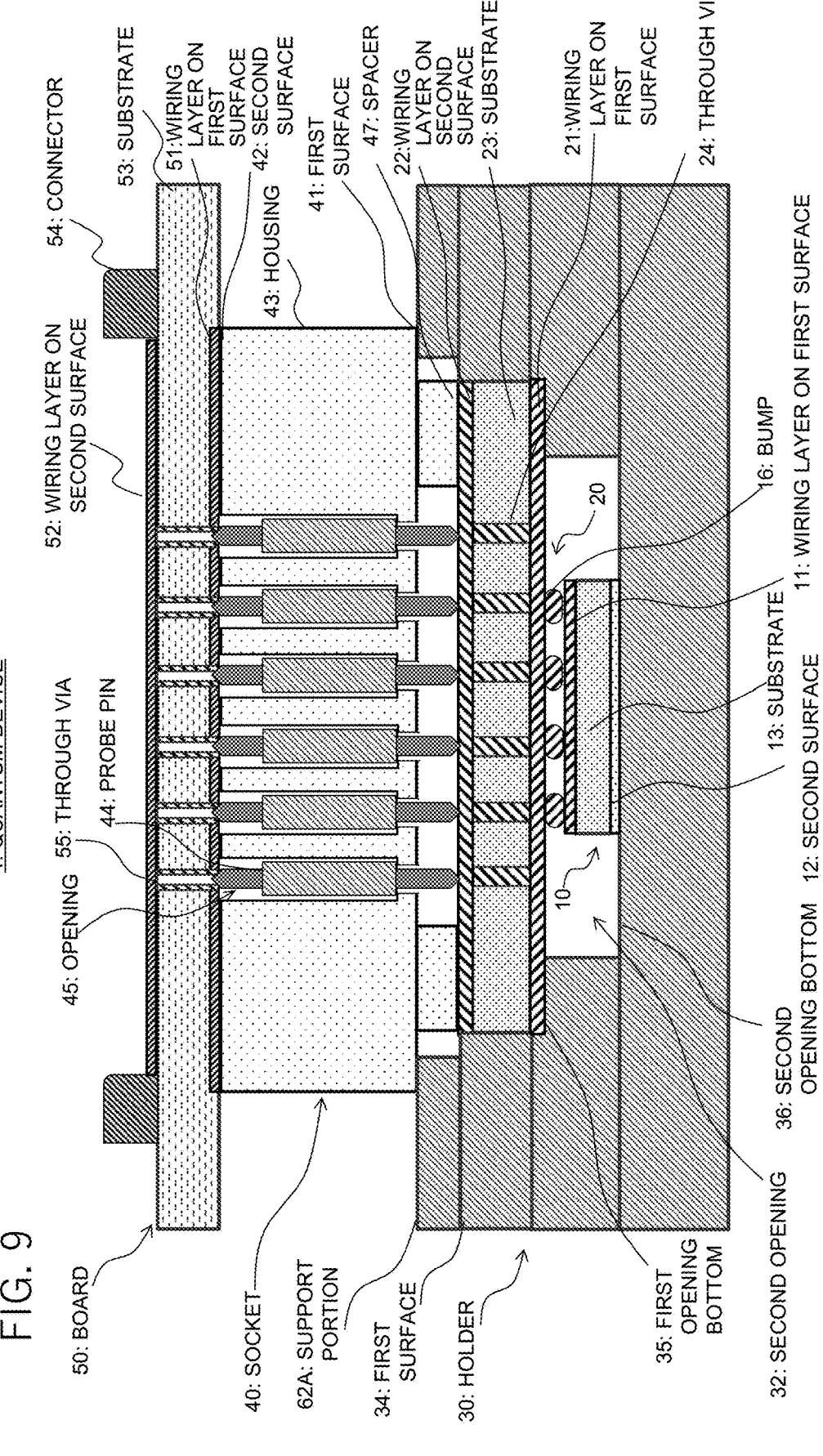

1: QUANTUM DEVICE

54: CONNECTOR

53: SUBSTRATE

51:WIRING LAYER ON FIRST SURFACE

42: SECOND SURFACE

41: FIRST SURFACE

47: SPACER

43: HOUSING

22:WIRING LAYER ON SECOND SURFACE

23: SUBSTRATE

21:WIRING LAYER ON FIRST SURFACE

24: THROUGH VIA

52: WIRING LAYER ON SECOND SURFACE

16: BUMP

20

11: WIRING LAYER ON FIRST SURFACE

13: SUBSTRATE

12: SECOND SURFACE

10

36: SECOND OPENING BOTTOM

55: THROUGH VIA

44: PROBE PIN

45: OPENING

50: BOARD

40: SOCKET

62A: SUPPORT PORTION

34: FIRST SURFACE

30: HOLDER

35: FIRST OPENING BOTTOM

32: SECOND OPENING

FIG. 14

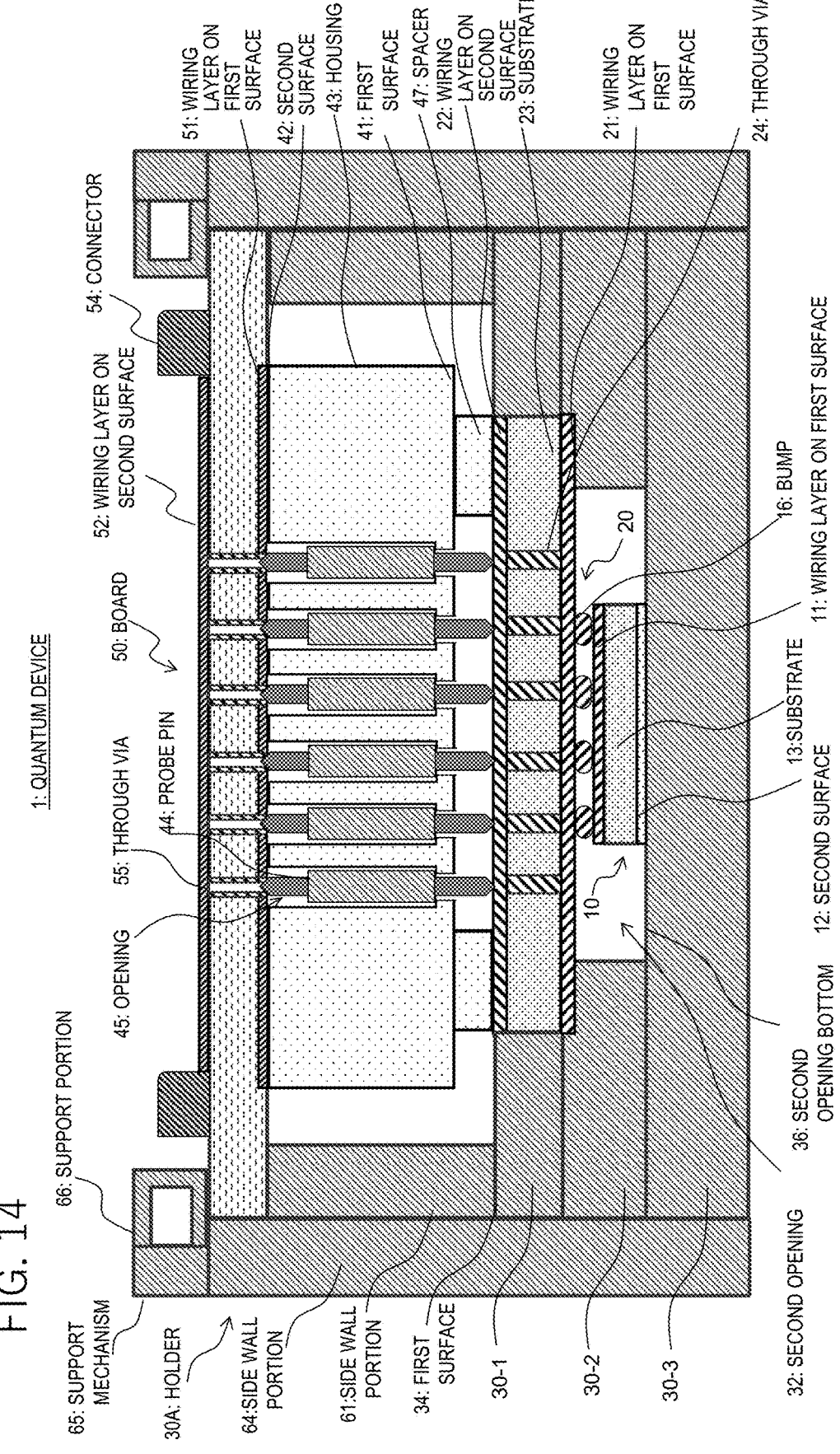

1: QUANTUM DEVICE

51: WIRING LAYER ON FIRST SURFACE
42: SECOND SURFACE
43: HOUSING
41: FIRST SURFACE
47: SPACER
22: WIRING LAYER ON SECOND SURFACE
23: SUBSTRATE
21: WIRING LAYER ON FIRST SURFACE
24: THROUGH VIA

54: CONNECTOR
52: WIRING LAYER ON SECOND SURFACE
50: BOARD
44: PROBE PIN
55: THROUGH VIA
45: OPENING
66: SUPPORT PORTION

16: BUMP
11: WIRING LAYER ON FIRST SURFACE
13: SUBSTRATE
36: SECOND OPENING BOTTOM
12: SECOND SURFACE 20
10

65: SUPPORT MECHANISM
30A: HOLDER
64: SIDE WALL PORTION
61: SIDE WALL PORTION
34: FIRST SURFACE
30-1
30-2
30-3
32: SECOND SURFACE

FIG. 15

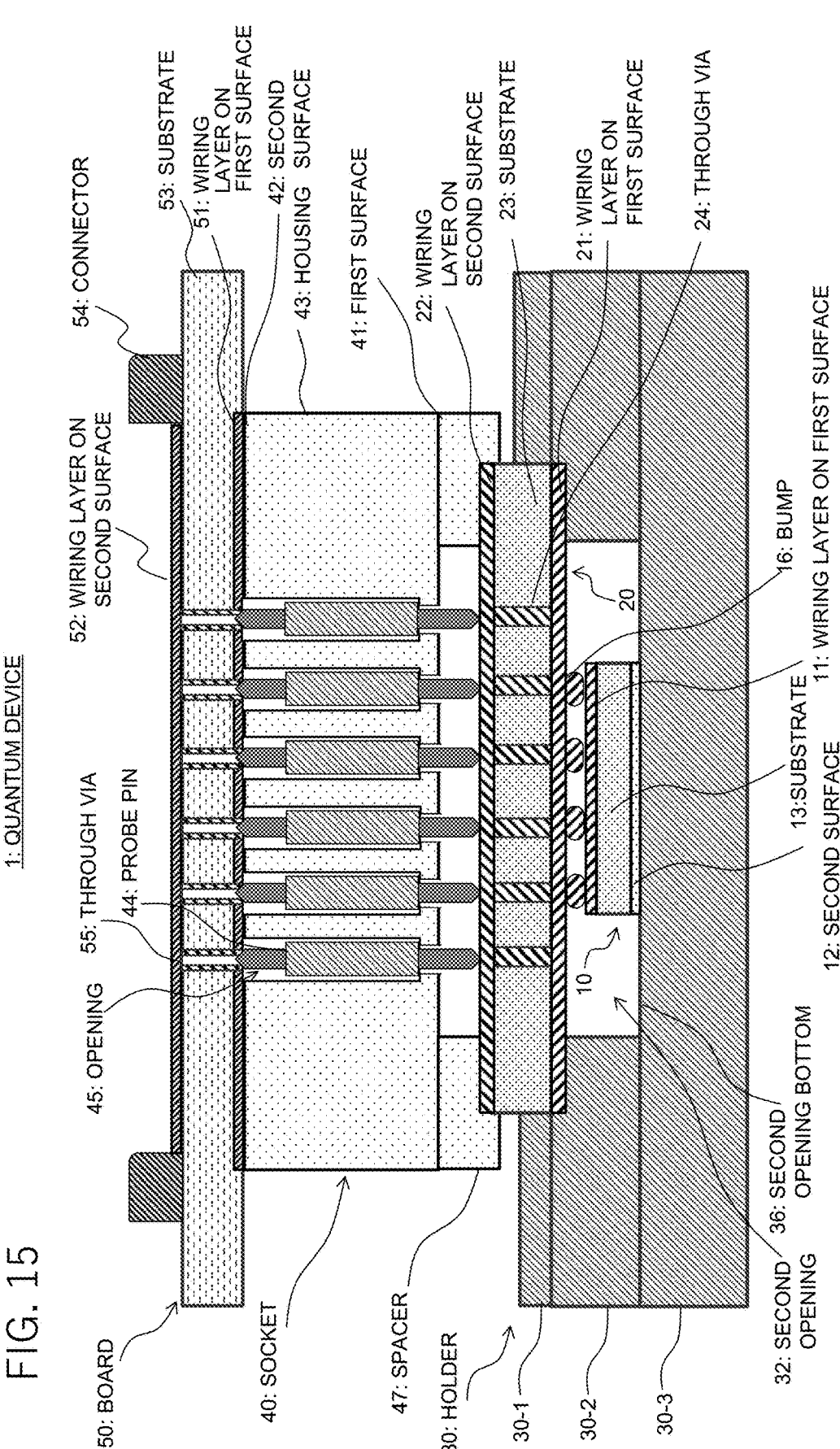

1: QUANTUM DEVICE

50: BOARD
40: SOCKET
47: SPACER
30: HOLDER
30-1
30-2
30-3

45: OPENING
52: WIRING LAYER ON SECOND SURFACE
55: THROUGH VIA
44: PROBE PIN

54: CONNECTOR
53: SUBSTRATE
51: WIRING LAYER ON FIRST SURFACE
42: SECOND SURFACE
43: HOUSING SURFACE
41: FIRST SURFACE
22: WIRING LAYER ON SECOND SURFACE
23: SUBSTRATE
21: WIRING LAYER ON FIRST SURFACE
24: THROUGH VIA

16: BUMP
11: WIRING LAYER ON FIRST SURFACE
13: SUBSTRATE
12: SECOND SURFACE 20
10

32: SECOND OPENING
36: SECOND OPENING BOTTOM

FIG. 20A

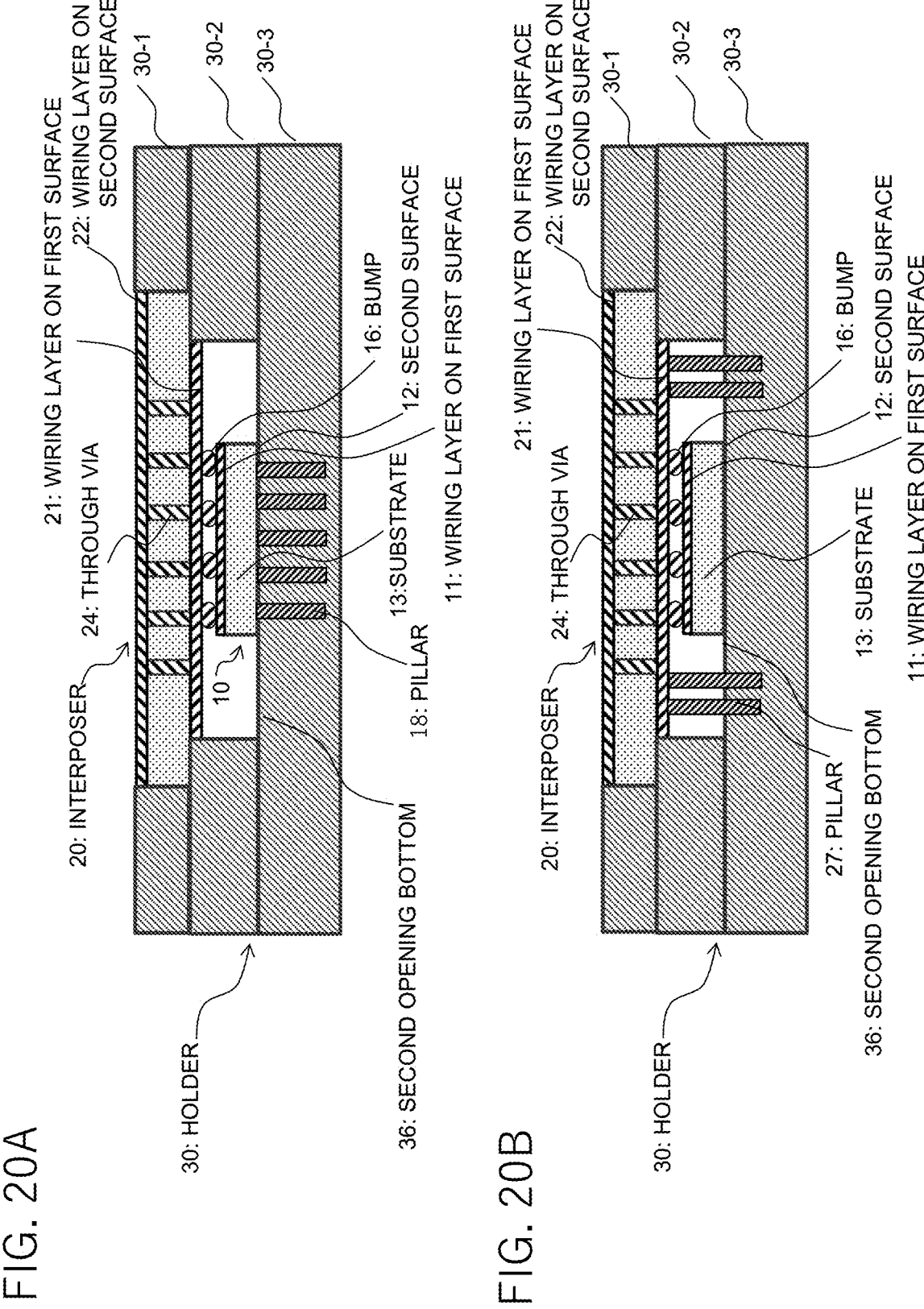

20: INTERPOSER

21: WIRING LAYER ON FIRST SURFACE
22: WIRING LAYER ON SECOND SURFACE 30-1
30-2
30-3

24: THROUGH VIA

16: BUMP

12: SECOND SURFACE

13:SUBSTRATE

11: WIRING LAYER ON FIRST SURFACE

18: PILLAR

10

30: HOLDER

36: SECOND OPENING BOTTOM

FIG. 20B

20: INTERPOSER

21: WIRING LAYER ON FIRST SURFACE
22: WIRING LAYER ON SECOND SURFACE 30-1
30-2
30-3

24: THROUGH VIA

16: BUMP

12: SECOND SURFACE

13: SUBSTRATE

11: WIRING LAYER ON FIRST SURFACE

27: PILLAR

30: HOLDER

36: SECOND OPENING BOTTOM

FIG. 23

QUANTUM DEVICE

FIELD

Cross Reference to Related Applications

This application is based upon and claims the benefit of the priority of Japanese patent application No. 2022-139991, filed on Sep. 2, 2022, the disclosure of which is incorporated herein in its entirety by reference thereto. This disclosure relates to a quantum device.

BACKGROUND

A probe pin (also called "movable pin", "contact probe," or "pogo pin") is used as a connector to ensure a stable connection between substrates. Regarding a probe pin, for example, Patent Literature (PTL) 1 discloses a configuration as illustrated in FIG. 24A.

Referring to FIG. 24A, a measurement apparatus 101 for evaluating circuit characteristics, etc. of an electronic circuit unit 102 includes a holding body 105 made of an insulating material, multiple probe pins 109 embedded in the holding body 105, and an evaluation substrate 106 on which the holding body 105 is placed. The electronic circuit unit 102 includes a circuit board 103 that mounts circuit elements and includes terminals (input/output terminals and ground terminals) 103a on a underside and a shield cover 104 that covers the circuit elements of the circuit board 103. The holding body 105 is attached to the evaluation substrate 106 by multiple screws 107. Multiple through holes (not shown) are formed in the holding body 105. The probe pin 109 of both-ends movable type is housed in the through hole in the holding body 105. An upper portion of the probe pin 109 is protruded from the through hole by a biasing force (elastic force) of a spring (not shown) arranged in the probe pin. An upper end of each barrel (not shown) of the probe pin is locked by a step portion (not shown) in the through hole to prevent the barrel of the probe pin from taking off from the holding body 105. A lower portion of the probe pin 109 is slidably housed in the through hole and is pressed against a surface of the evaluation substrate 106 by the biasing force of the spring (not shown).

As describe above, a probe pin has been used for electrical connection between substrates, in testing of, for example, a circuit board or a silicon substrate (wafer). Recently, a probe pin has been in a wide spread use, as a connector for inter-substrate connection in various electronic apparatuses, in addition to testing of a semiconductor or a substrate. The reason may be ascribable to enhanced reliability and durability, ease for assembling such as alignment, and power feeding performance with miniaturization and improved quality and stabilization of connection of the probe pin. A probe pin is also used in a quantum computer including a superconducting quantum circuit, etc., as well as in a quantum device (PTL 2).

In FIG. 24A, suppose that the holding body 105 and the evaluation substrate 106 are deformed concave to the circuit board 103, as illustrated in FIG. 24B, which may be caused by a difference in linear expansion coefficients of the circuit board 103, the holding body 105, and the evaluation substrate 106. In this case, at a center portion of the holding body 105, at which a gap between the holding body 105 and the circuit board 103 has expanded, the probe pin 109, which are pushed into the holding body 105 to be housed therein, receives the biasing force of the spring (not shown) and protrudes further toward the circuit board 103, thus contact with the terminal 103a being maintained and electrical connection being secured. Therefore, the device ensures connection reliability and a design margin against a substrate deformation, etc. That is, in response to volume change such as shrinkage due to cooling, the probe pin is able to move to maintain contact with a terminal 103a to effectively prevent wire breakage.

However, when the device is placed in a refrigerator and cooled to an extremely low temperature, for example, deformation can further increase due to accumulated errors, and/or differences in the linear expansion coefficients of multiple members in the device. This may result in such a situation in which the circuit board 103 may tilt, as illustrated schematically in FIG. 24C, for example. In this case, the gap between the holding body 105 and the circuit board 103 expands and exceeds a stroke (movable range) of the probe pin 109, as a result of which there are one or more probe pins 109 that are disabled to make contact with the terminal 103a.

PTL1: Japanese Unexamined Patent Application Publication No. 2002-148306 A
PTL2: Japanese Unexamined Patent Application Publication No. 2022-2234 A

SUMMARY

The following analysis are given by the present inventors. As described above, in an electronic apparatus in which electrical connection between substrates is provided by a probe pin (s), when a temperature changes from a room temperature to an extremely low temperature, deformation or tilting of the substrate may occur due to an accumulated errors and/or differences in linear expansion coefficients of multiple members, as a result of which, there may be a case in which contact of a probe pin (s) with a terminal (s) on the substrate may become unstable or disconnected. In addition, deformation or tilting of the substrate may cause a change in a distance between a signal conductor (e.g., a probe pin for signal transmission and a terminal on the substrate in contact with the probe pin) and a dielectric. This causes an impedance mismatch in a signal line, thus issues such as degradation of connection reliability and signal quality becoming apparent.

Accordingly, it is an object of the disclosure to provide a quantum device that uses a probe pin(s) for connection between substrates, enabled to ensure connection reliability and signal quality.

A quantum device of one aspect of the disclosure includes a quantum chip including a superconducting quantum circuit, an interposer, a housing, a board and one or more spacers.

The interposer includes a substrate, a first wiring layer on a first surface of the substrate, with the quantum chip mounted thereon, and a second wiring layer on a second surface of the substrate opposite to the first surface.

The housing includes a plurality of openings penetrating through the housing from a first surface of the housing to a second surface opposite the first surface of the housing, the first surface of the housing opposing the second surface of the interposer, and a plurality of probe pins respectively housed in the plurality of openings, a first end of each of the plurality of probe pins in contact with a corresponding terminal of a plurality of terminals provided on the second wiring layer of the interposer.

The board includes a wiring layer on a first surface of the board faced to the second surface of the housing, the wiring layer of the board including a plurality of terminals, each in contact with a second end of a corresponding one of the plurality of probe pins housed respectively in the plurality of openings in the housing.

The one or more spacers are provided between the first surface of the housing and the second surface of the interposer to ensure a clearance between the first surface of the housing and the second surface of the interposer opposing the first surface of the housing.

According to the disclosure, it is possible to ensure connection reliability and signal quality in quantum device that uses a probe pin for electrical connection between substrates.

BRIEF DESCRIPTION OF DRAWINGS

FIG. 4 is a schematic cross-sectional view illustrating a variation of the example of the disclosure.

FIG. 5A illustrates variations of the example of the disclosure.

FIG. 7 is a schematic cross-sectional view illustrating a variation of the example of the disclosure.

FIG. 8A is a schematic cross-sectional view illustrating a variation of the example of the disclosure.

FIG. 8C is a schematic see-through perspective view illustrating the variation illustrated in FIG. 8A.

FIG. 9 is a schematic cross-sectional view illustrating a variation of the example of the disclosure.

FIG. 14 is a schematic cross-sectional view illustrating a variation of the example of the disclosure.

FIG. 15 is a schematic cross-sectional view illustrating a variation of the example of the disclosure.

FIG. 20A and FIG. 20B are schematic cross-sectional views illustrating variations of the example of the disclosure.

FIG. 23 is a schematic cross-sectional view illustrating a variation of the example of the disclosure.

EXAMPLE EMBODIMENTS

Figure 1A:
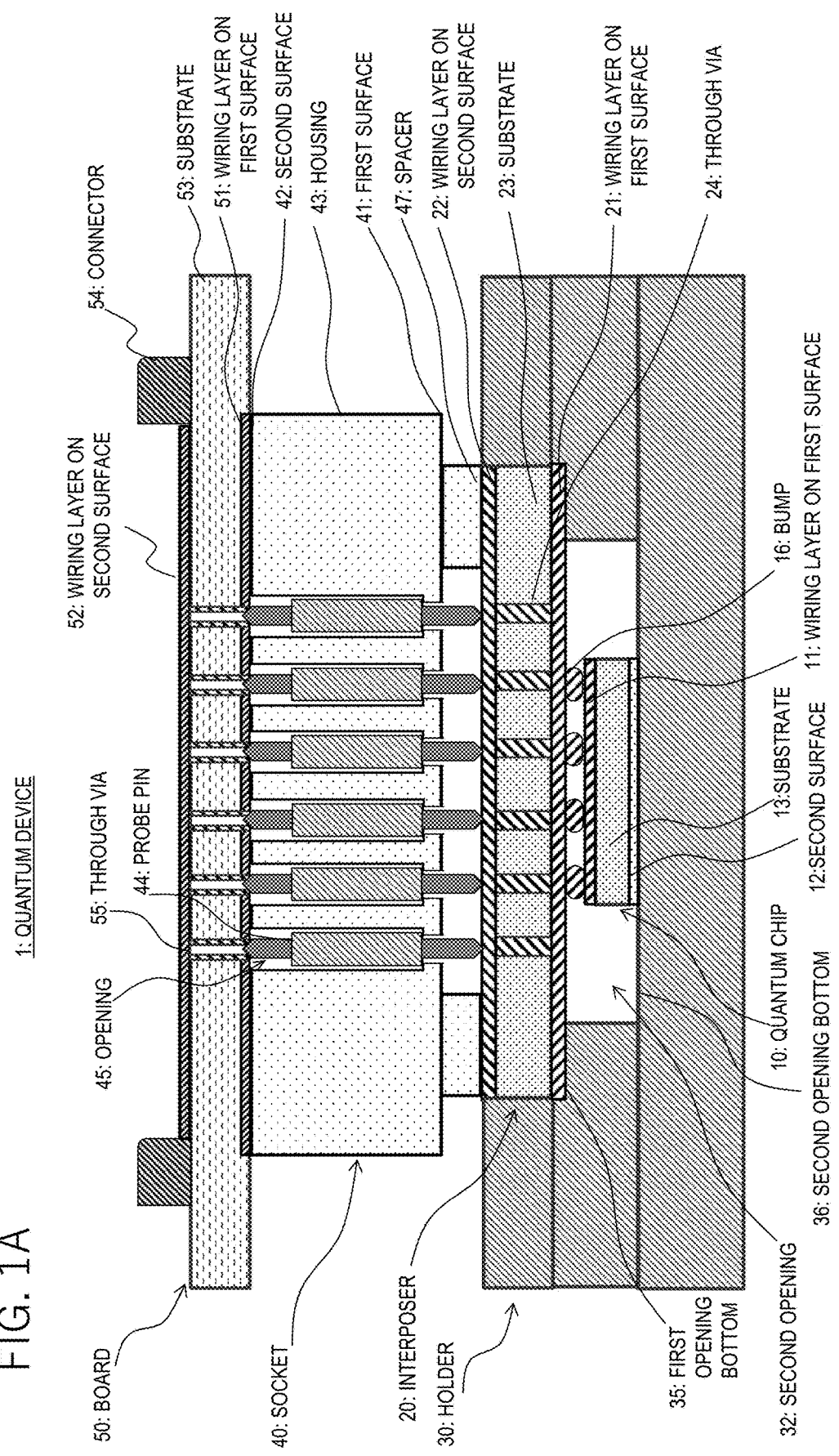
FIG. 1A is a schematic cross-sectional view illustrating an example of the disclosure.

In the following description of examples, reference is made to the accompanying drawings in which it is shown by way of illustration specific examples that can be practiced. It is to be understood that other examples can be used and structural changes can be made without departing from the scope of the various examples. It is noted that in the disclosure, the expression "at least one of A and B" means A, B, or (A and B). The term expressed as "- -(s)" includes both singular and/or plural form. FIG. 1A schematically illustrates one example of the disclosure. In FIG. 1A, a quantum device 1 includes a quantum chip 10, an interposer 20, a socket 40 and a board 50. In the example illustrated in FIG. 1A, the interposer 20 is placed on a holder 30. The quantum chip includes a substrate 13 and a wiring layer 11 on a first surface of the quantum chip 10. The substrate 13 of the quantum chip 10 includes, for example, silicon (Si). The substrate 13 is not limited to those including silicon and may include those including other electronic materials such as sapphire or compound semiconductor materials (Groups IV, III-V, and II-VI). Single-crystalline materials may preferably be used as the substrate 13, but polycrystalline materials or amorphous materials may be used.

In FIG. 1A, the quantum chip 10 is flip-chip mounted on the interposer 20, i.e., the wiring layer 11 on the first surface of the quantum chip 10 is faced to and mounted on a wiring layer 21 on a first surface of the interposer 20. It is noted that a substrate (wiring substrate) that provides electrical connection between circuits of front and back wiring layers by a through via hole(s) may be termed as an interposer. The interposer 20 may also perform a pitch conversion of a fine pitch terminals of the quantum chip 10 to/from a pitch for external connection.

The wiring layer 11 on the first surface of the quantum chip 10 includes a wiring pattern of a superconducting quantum circuit. The wiring layer 11 patterned on the first surface side of the substrate 13 includes superconducting materials such as niobium (Nb). It is noted that the superconducting materials used in the wiring layer 11 is not limited to niobium (Nb). For example, the superconducting materials may include niobium nitride, aluminum (Al), indium (In), lead (Pb), tin (Sn), rhenium (Re), palladium (Pd), titanium (Ti), or an alloy including at least one selected therefrom.

As a non-limiting example, the superconducting circuit (quantum circuit) formed on the wiring layer 11 on the first surface of the quantum chip 10 may be configured to include a quantum bit (qubit) including a resonator having a Super-conducting Quantum Interference Device (SQUID) having a loop of a superconducting wiring with two or more Joseph-son junctions in the loop, and/or a coupler which couples multiple qubits. As the superconducting materials may be, for example, A1. The Josephson junction may be formed by depositing a first A1 film on the substrate 13 by oblique deposition, oxidizing the first A1 film to form an A1 oxide film, and depositing a second A1 film by oblique deposition in the reverse direction.

A terminal of the wiring layer 11 on the first surface of the quantum chip 10 and a corresponding terminal of the wiring layer 21 on the first surface of the interposer 20 are arranged facing each other and directly connected by a bump (metal protrusion) 16. The bump 16 may be formed on the wiring layer 21 on the first surface of the interposer 20, or on the wiring layer 11 on the first surface of the quantum chip 10.

The bump 16 has a protrusive shape suited to height control of inter-substrate spacing to be bonded, and any shape can be selected, such as columnar (cylindrical, polygonal, etc.), pyramidal (which can include a truncated cone and a truncated pyramid as well as a cone, and a pyramid, etc.), spherical, rectangular, etc. The bump 16 may be made of normal-conducting materials and formed by laminating superconducting materials. The bump 16 may include the same superconducting materials as the wiring layer 11 of the quantum chip 10. Alternatively, the bump 16 may include different superconducting materials than the wiring layer 11.

In a case where the bump 16 includes multiple metal layers, at least one layer may preferably include a super-conducting material. The bump 16 may have a layered structure including Nb/In (Sn, Pb, or an alloy including at least one of Sn and Pb)/Ti/Nb (a surface of the wiring layer 21 on the first surface of the interposer 20)/Cu, or a layered structure including Nb (a surface of the wiring layer 11 on the first surface of the quantum chip 10)/Nb (the surface of the wiring layer 21 on the first surface of the interposer 20)/Cu. Alternatively, the bump 16 may have a layered structure including Nb (the surface of the wiring layer 11 on the first surface of the quantum chip 10)/In (Sn, Pb, or an alloy including at least one of Sn and Pb)/Ta (the surface of the wiring layer 21 on the first surface of the interposer 20)/Cu. Further, in a case where the bump 16 includes Al and In, TiN may be used for a barrier layer in order to prevent Al and In from forming an alloy. In such a case, the bump 16 may have a layered structure including Al (the surface of the wiring layer 11 on the first surface of the quantum chip 10) /Ti/TiN/In (Sn, Pb, or an alloy including at least one of Sn and Pb) /TiN/Ti/Al (the surface of the wiring layer 21 on the first surface of the interposer 20)/Cu. It is noted that Ti is an adhesion layer. A flip-chip connection is preferably Nb (the surface of the wiring layer 11 on the first surface of the quantum chip 10)/In/Ti/Nb (the surface of the wiring layer 21 on the first surface of the interposer 20)/Cu, or Nb (the surface of the wiring layer 11 on the first surface of the quantum chip 10)/Nb (the surface of the wiring layer 21 on the first surface of the interposer 20)/Cu. Alternatively, the bump 16 is made of normal conducting materials such as Cu or silicon dioxide ($SiO_2$), and may have a surface covered with a film of superconducting materials.

As a non-limiting example, a width of the bump 16 may be on an order of a few (or several) to a few (or several) tens of micrometers, and a height of the bump 16 may be on an order of a few (or several) to a few (or several) tens of micrometers. Bonding of the quantum chip 10 and the bump 16 may be performed using solid phase bonding. The inside chamber of a refrigerator is evacuated. Among solid-phase bonding methods, surface activation bonding and ultrasonic bonding may be used. In addition, melt joining may be used when high temperature can be applied during bonding. Pressure welding may be used when resin can be used.

The interposer 20 includes a substrate 23, the wiring layer 21 on the first surface of the interposer 20, a wiring layer 22 on a second surface of the interposer 20, and a through via(s) 24, which connects corresponding terminal(s) (pad(s)) of the wiring layer 21 on the first surface and the wiring layer 22 on the second surface. In the interposer 20, a surface opposing the quantum chip 10 is termed as the first surface and a surface opposite to the first surface is termed as the second surface.

Material of the substrate 23 of the interposer 20 may be silicon in consideration of a linear expansion coefficient and other factors, when material of the substrate 13 of the quantum chip 10 is silicon. In this case, the substrate 23 may be termed as a silicon interposer. The substrate 23 is not limited to silicon, but other electronic material(s) such as sapphire or compound semiconductor materials (group IV, III-V and II-VI) glass, and ceramics may be used. When the substrate 23 of the interposer 20 is silicon, the through via(s) 24 is referred to as a thorough silicon via(s) (TSV). In this case, in a wafer process, a via hole of the through via 24 may be formed after a wiring process on the substrate 23 (via last). In the via last, etching or laser beam may be used for forming the via hole, and plating may be used for filling a conductor in the via hole. The conductor filled into the via hole may be superconducting material or normal-conducting material, as with the wiring layer 21 on the first surface and the wiring layer 22 on the second surface of the interposer 20. The via hole may be formed in the substrate 23 first, and then the wiring process on both sides of the substrate may be performed.

The bump(s) 16 may be formed on the wiring layer 21 on the first surface in a fabrication process of the interposer 20. The wiring layer 21 on the first surface of the interposer 20 may include the above-mentioned superconducting material(s). The wiring layer 21 on the first surface may include the same superconducting material(s) as that included in the wiring layer 11 on the first surface of the quantum chip 10, or superconducting material(s) different from that included in the wiring layer 11 on the first surface of the quantum chip 10.

The wiring layer 21 on the first surface of the interposer 20 includes the above-mentioned superconducting materi-als. The wiring layer 21 on the first surface of the interposer 20 may include the same superconducting material(s) as that (those) included in the wiring layer 11 on the first surface of the quantum chip 10, or superconducting material(s) differ-ent from that/those included in the wiring layer 11. For example, the wiring layer 21 on the first surface of the interposer preferably includes Nb (e.g., 0.1 μm (micrometer) thick), Cu (e.g., 2 μm thick), and Ti in this order as viewed from a surface towards the substrate 23. For example, in a case where the substrate 23 includes silicon, the first surface of the interposer 20 may have a configuration of Nb/Cu/Ti/$SiO_2$/Si (substrate 23). The wiring layer 21 on the first surface of the interposer 20 may be a single layer or composed of a plurality of layers.

The wiring layer 22 on the second surface of the interposer 20 may include the same superconducting material(s) as that(those) included in the wiring layer 11 on the first surface of the quantum chip 10 and in the wiring layer 21 on the first surface of the interposer 20, or superconducting material(s) different from that(those) included in the wiring layer 11 on the first surface of the quantum chip 10 and in the wiring layer 21 on the first surface of the interposer 20. The wiring layer 22 on the second surface of the interposer 20 may include normal-conducting material(s). The normal-conducting materials may include, for example, copper (Cu), silver (Ag), gold (Au), platinum (Pt), or an alloy including at least one selected therefrom. For example, the wiring layer 22 on the second surface of the interposer 20 may preferably include Ti and Cu laminated in this order on the second surface of the substrate 23. For example, in a case where the substrate 23 includes silicon, the wiring layer 22 on the second surface of the interposer 20 may have a configuration of $Cu/Ti/SiO_2/Si$ (substrate 23). The wiring layer 22 on the second surface of the interposer 20 may be a single layer or composed of a plurality of layers.

The socket 40 is disposed opposing the wiring layer 22 on the second surface of the interposer 20. In the socket 40, a surface on a side opposing the interposer 20 is termed as a first surface and a surface opposite to the first surface is termed as a second surface. The socket includes a housing (also referred to as a "socket housing") 43 and a plurality of openings 45 in which a plurality of probe pins 44 are respectively housed. An opening on a side of a first surface 41 and a side of a second surface 42 may be denoted as the reference numerals 45-1 and 45-2, respectively. When distinction between a side of the first surface 41 and a side of the second surface 42 is not needed, the opening is denoted by the reference numeral 45.

As a non-limiting example, the housing 43 may preferably include a material(s) with a linear expansion coefficient of, for example, $0.5\sim50\times10^{-6}$/K (Kelvin). The housing 43 may preferably include an insulating material(s). A part of the housing 43 in contact with the probe pin 44 may include an insulating material(s). The housing 43 may preferably include a non-magnetic material(s). Further, the housing 43 may preferably include a material(s) with a linear expansion coefficient equivalent to that of the interposer 20. The housing 43 may include quartz or a plastic such as an engineering plastic. The housing 43 may include composite materials with a low linear expansion coefficient, including any one selected from a group including aluminum oxide ($Al_2O_3$), mica-based machinable ceramic, aluminum nitride (AlN), zirconia ($ZrO_2$), macor-based machinable ceramic, glass, a resin, and a silica filler. Alternatively, the housing 43 may include a superconducting material(s) as long as insulation from the probe pin 44 can be ensured. The housing 43 may be configured by a resin with an insulating property and is not damaged even when contacted with the interposer 20.

A spacer(s) 47 disposed between the wiring layer 22 on the second surface of the interposer 20 and the first surface 41 of the housing 43 may be integrally formed with the housing 43. Alternatively, each spacer 47 may be manufactured separately from the housing 43. Regarding the spacer 47 manufactured separately from the housing 43, each of the spacer(s) 47 may be joined (glued) to the first surface 41 of the housing 43 into a unit. This unit is placed on the interposer 20 with a bottom surface of each spacer 47 in contact with wiring layer 22 on the second surface of the interposer 20. Alternatively, a bottom surface of each spacer 47 manufactured separately from the housing 43 may be made to contact with the wiring layer 22 on the second surface of the interposer and then the first surface 41 of the housing may be made to contact with a top surface of each spacer 47, while remaining separate from the housing 43. Dimensional accuracy can be enhanced by integrally forming the spacer(s) 47 with the housing 43. That is, in the case of forming the spacer(s) 47 integrally with the housing 43, height control of a gap between the housing 43 and the interposer 20 becomes more precise as compared with the case of manufacturing the spacer(s) 47 separately from the housing 43.

Figure 1B:
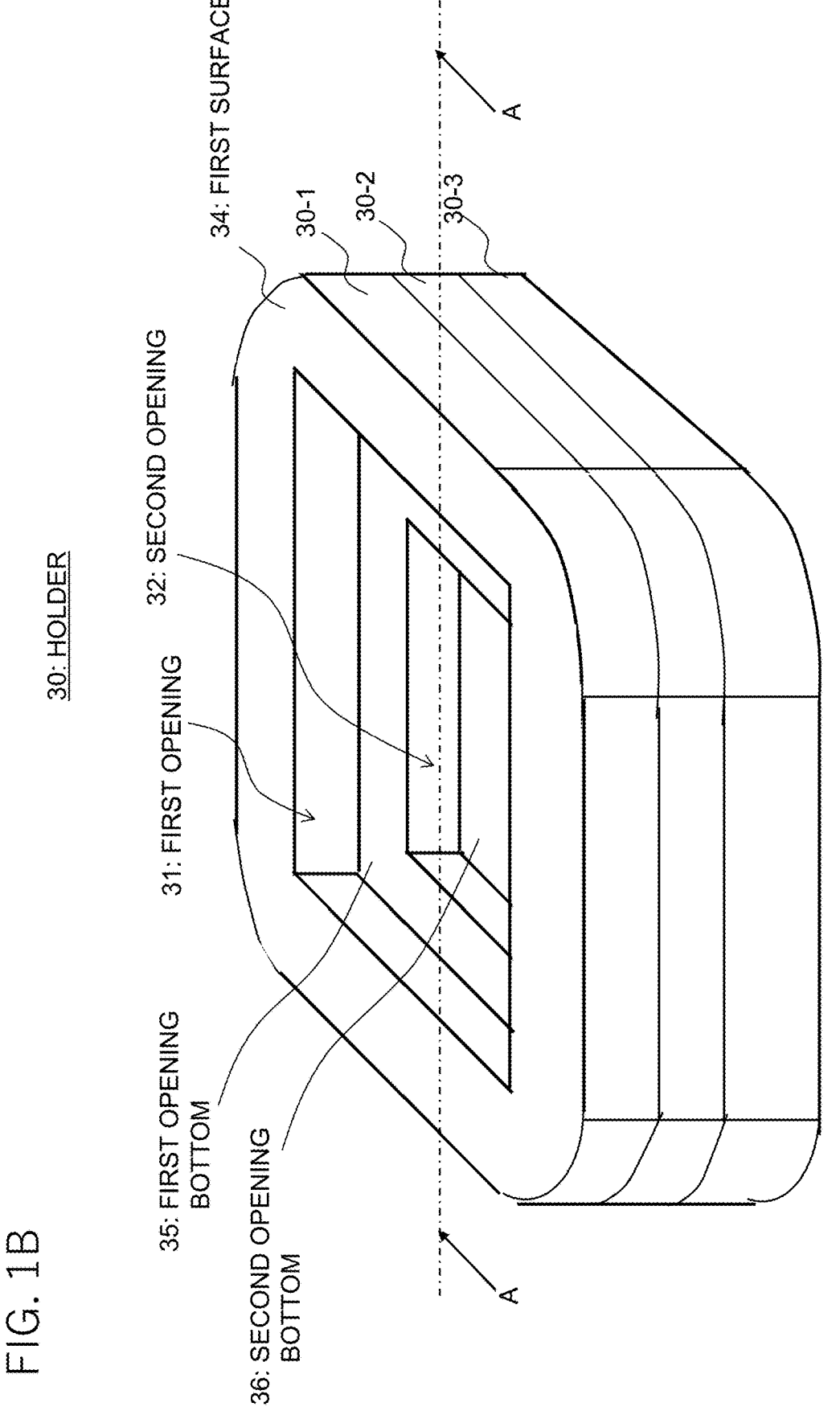
FIG. 1B is a schematic perspective view illustrating the example of the disclosure.
Figure 1C:
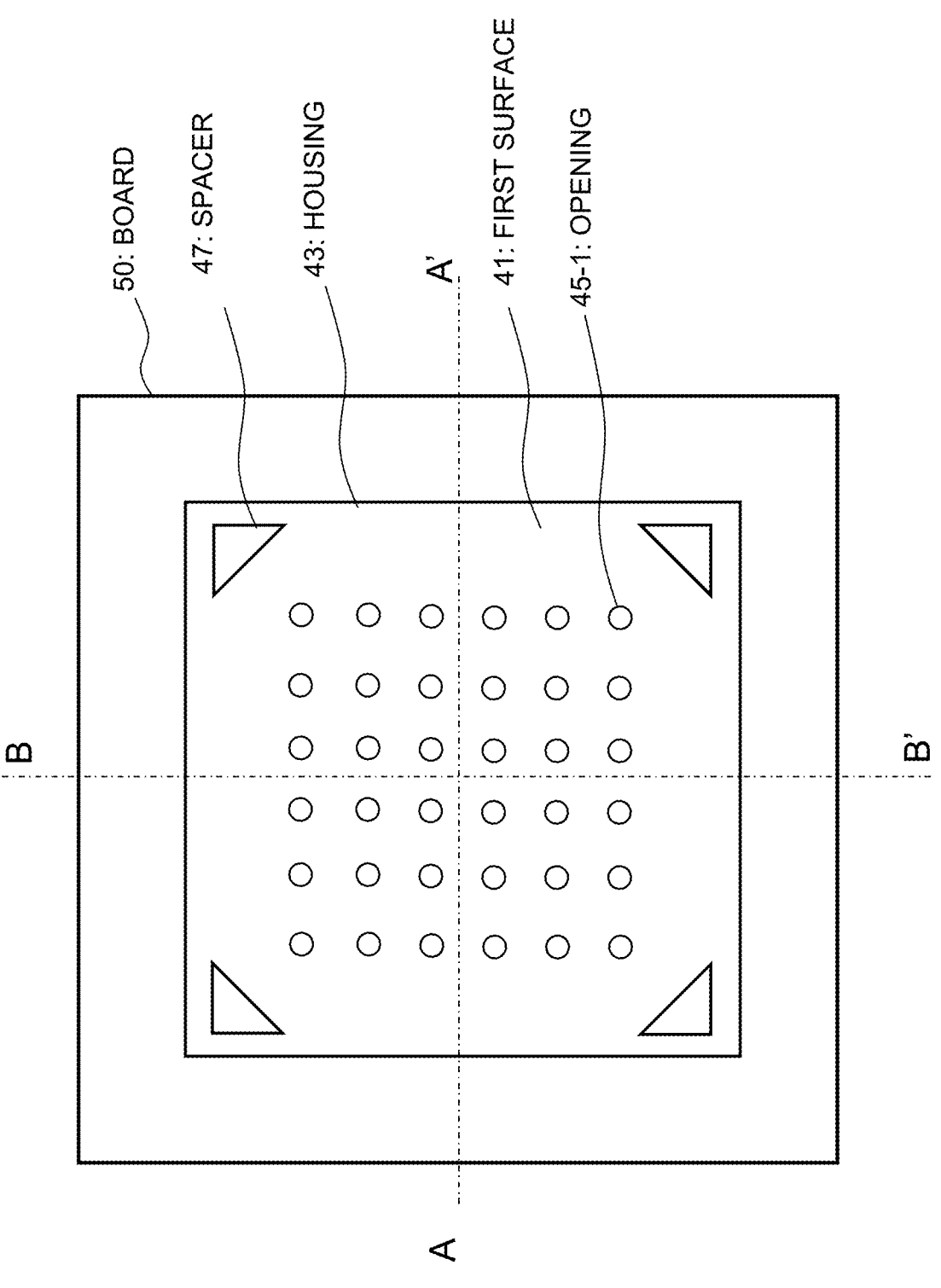
FIG. 1C is a schematic plan view illustrating the example of the disclosure.

FIG. 1C is a schematic plan view which views from below the first surface 41 of the housing 43 and the board 50. FIG. 1C illustrate an example arrangement of the spacer 47 on the first surface 41 of the housing 43. A portion of the schematic cross-sectional view illustrated in FIG. 1A corresponds to a cross-sectional view of an A-A' line (or a B-B' line which is orthogonal to the A-A' line) in FIG. 1C. FIG. 1C illustrates multiple openings 45-1 on the first surface 41 side of the plurality of openings 45 housed respectively in multiple probe pins 44 not shown. FIG. 1A illustrates an end face of the spacer 47 viewed orthogonally to the A-A' line illustrated in FIG. 1C.

Referring to FIG. 1C, four spacers 47 are disposed respectively at four corners of the housing 43, which has a rectangular shape (square). A planar shape of the spacer 47 is a right-angled isosceles triangle. As a non-limiting example, two sides that make an apex angle of a right-angle of the spacer 47 are parallel to two sides of the housing 43, respectively. An oblique side of the spacer 47 at one corner of the housing 43 is disposed opposite and parallel to an oblique side of the other spacer 47 at the other corner which is positioned diagonal to the one corner in the rectangular shaped first surface 41 of the housing 43.

As illustrated in FIG. 1C, a barycentric position (gravity center position) of the spacers 47 disposed respectively at four corners of the first surface 41 of the housing 43 is located at a center of the first surface 41 in which the A-A' line and the B-B' line intersect. The probe pins 44 are respectively housed at locations of the openings 45-1 on the first surface 41 of the housing 43. A barycentric position of the probe pins 44 is located at a center of the first surface 41 at which the A-A' line and the B-B' line intersect. In FIG. 1A and FIG. 1C, the number of the probe pins 44 housed in the housing 43 is 6×6=36, for the sake of simplicity. However, the number of the probe pins 44 is, as a matter of course, not limited to such number.

In FIG. 1C, the four spacers 47 are disposed respectively at the four corners of the first surface 41 of the housing 43, but the arrangement of the spacers 47 is as a matter of course not limited to this. For example, in a configuration where terminals of the interposer and terminals of the board 50 are connected respectively via the probe pins 44 supported by the socket 40, the spacer(s) 47 may be disposed at any position(s) such that the spacer(s) 47 do not interfere with the probe pins 44 (i.e., do not overlap the positions of the openings 45-1), as described below. In this case also, from a viewpoint of thermal stress and thermal strain, the barycentric position of the spacers 47 preferably coincide with the barycentric position of the probe pins 44. Alternatively, a center point of the first surface 41 (or even the second surface 42) of the housing 43 may coincide with a center point of the four spacers 47 (in FIG. 1C, an intersection point of the A-K line and the B-B' line).

When the barycentric position of the spacers 47 is made to be coincident with the barycentric position of the probe pins 44, in the housing 43 having a rectangular shape, a barycentric coordinate $(X_G, Y_G)$ of the four spacers 47 is given by the following equation. In the following equation, a center of an intersection point of the A-K line and the B-B' line is assumed to be the origin.

$$X_G = \Sigma^4_{i=1} X_i \times M_i / (\Sigma^4_{i=1} M_i),$$

$$Y_G = \Sigma^4_{i=1} Y_i \times M_i / (\Sigma^4_{i=1} M_i)$$

where $(X_i, Y_i)$ and M (i=1, . . . ,4) are a barycentric coordinate (two-dimensional coordinates) and a weight of each spacer 47 (isosceles triangle).

Let a coordinate of a center and a weight of each probe pin 44 to be (xi,yi) and mi (i=1, . . . ,36), a barycentric coordinate $(x_G, y_G)$ of the probe pins 44 is given by the following equation.

$$x_G = \Sigma^{36}_{i=1} x_i \times m_i / (\Sigma^{36}_{i=1} m_i),$$

$$y_G = \Sigma^{36}_{i=1} y_i \times m_i / (\Sigma^{36}_{i=1} m_i)$$

The following preferably holds.

$$(X_G, Y_G) = (x_G, y_G)$$

If the spacers 47 have the same weight and the probe pins 44 have the same weight, the barycentric coordinate $(X_G, Y_G)$ of the spacers 47 at the four corners and the barycentric coordinate $(x_G, y_G)$ of the probe pins 44 arranged in a 6×6 array are both at the origin (in FIG. 1C, a point at which the A-K line and the B-B' line intersect). For example, in the housing 43 having a rectangular shape, the spacers 47 and the probe pins 44 are disposed line-symmetrically with respect to the A-K line and the B-B' line, but, as a matter of course, a configuration in which the barycentric of the arrangement of the spacers 47 coincides with the barycentric of the arrangement of the probe pins 44 is not limited to the example illustrated in FIG. 1C.

In FIG. 1A, the spacer 47 is in contact with a ground plane (ground pattern) of the wiring layer 22 on the second surface of the interposer 20, but the configuration is not limited to this. A configuration may be also implemented in which interposer 20 has no wiring layer 22 on the second surface at a portion directly under the spacer 47, and an under surface of the spacer 47 is in contact with a second surface of the substrate 23 of the interposer 20.

The spacer 47, when made of a dielectric material(s) (insulating material(s))), has following advantages.

No short-circuit;

High process selectivity (cutting, grinding, molding, 3D printing, etc.), in a case the spacer is made of plastics; and High-precision machining is possible by lamination polishing and lamination grinding, in a case the spacer is made of ceramics.

The spacer 47, when made of a conductive material(s), has following advantages.

Reinforcement of ground;

Improvement of heat dissipation;

High process selectivity (cutting, grinding, molding, 3D printing, etc.);

Ease in manufacturing; and

Selectivity of a conductive material (normal conductor or superconductor can be selected).

In an example illustrated in FIG. 1C, the spacer 47 is configured as a triangular pole (right-angle triangle pole). The spacer 47 can also be a triangular pyramid form, such as a truncated triangular pyramid. Furthermore, as described below, various shapes (variations) are available for the spacer 47.

Referring again to FIG. 1A, one end (tip of a first plunger) and the other end (tip of a second plunger) of each of the probe pins 44 are in contact with the terminal (pad) of the wiring layer 22 on the second surface of the interposer 20 and a terminal (pad) of a wiring layer 51 on a first surface of the board 50, respectively, in an axially compressed state.

Regarding the probe pin 44, a metal (alloy materials) with excellent conductivity, high hardness, and excellent processability may be used. The probe pin 44 may include a superconducting material which is the same as, or different from, the wiring layer 11 on the first surface of the quantum chip 10. Alternatively, the probe pin 44 may include a normal-conducting material(s) which is/are the same as, or different from the wiring layer 22 on the second surface of the interposer 20. The probe pin 44 may preferably be made of a non-magnetic material. The probe pin 44 may preferably include any one selected from a group including a palladium (Pd) alloy, a gold alloy, beryllium copper (BeCu), gold (plated), niobium (Nb), niobium titanium (Nb—Ti), and titanium (Ti).

The board 50 includes a substrate 53, the wiring layer 51 on the first surface of the substrate 53, a wiring layer 52 on a second surface thereof, and a through via(s) 55 each of which penetrates through the substrate 53 for connecting a terminal of the wiring layer 51 on the first surface and a terminal of the wiring layer 52 on the second surface. In the board 50, a surface facing the socket 40 is termed as the first surface and a surface on a side opposite to the first surface is termed as the second surface. The substrate 53 may be composed by a single layer or multiple layers. Material of the substrate 53 may include, for example, epoxy, acrylic, urethane, polyimide, phenol, liquid crystal polymer, etc., may include silica, organic resin, ceramic filler or glass fiber, may include solidified ceramic powder, or may include ceramic alumina, AlN, sapphire, etc. The wiring layer 52 on the second surface of the board 50, is provided with a connector (s) 54 for inputting/outputting of a signal from/to an outside (apparatus externally arranged). As a non-limiting example, the connector 54 may be configured to include multiple coaxial connectors (coaxial receptacles) connectable with a bundle of flexible coaxial cables (not shown). The through via 55 is illustrated as a via (conformal via) in which a conductive layer is formed with a constant thickness along an inner wall of a via hole, but the through via 55 may be a filled via which is a via hole (closed via hole) filled with a conductive layer(s).

The quantum chip 10, the interposer 20, and the socket 40 are disposed in an opening formed on a surface of the holder 30. As illustrated in FIG. 1B, a first opening 31 having a largest opening diameter is provided on the surface of the holder 30, and a second opening 32 is provided in a central part of a bottom (first opening bottom) 35 of the first opening 31. In FIG. 1B, the holder 30 is a square prism with rounded corners, but the planar and three-dimensional shapes of the holder 30 are, as a matter of course, not limited to the configuration illustrated in FIG. 2B.

The holder 30 has a cooling function. For example, the holder 30 is a cold stage that can be cooled to an extremely low temperature of about 10 mK (milli-Kelvin) by a refrigerator. The holder 30 preferably includes a metal such as Cu, a Cu alloy, Al, etc. In a case where the holder 30 includes Al, it may be insulated by carrying out an alumite treatment. The quantum device 1 according to the example uses a superconducting phenomenon at an extremely low temperature of 9.2 [K] or lower in a case where Nb is included as superconducting materials of the quantum chip 10, or uses a superconducting phenomenon at an extremely low temperature of 1.2 [K] or lower in a case where Al is included as the superconducting materials of the quantum chip 10. That is why the holder 30 that can be cooled to such an extremely low temperature is used. As described above, the holder 30 preferably includes metal, but is not limited thereto. For example, high thermal conductivity ceramics such as zirconia ($ZrO_2$), glass, CFRP (Carbon Fiber Reinforced Plastics), etc. may be used for the holder 30.

The holder 30 may include a third pedestal (bottom base) 30-3 of a plate shape, a second hollow pedestal 30-3 of a plate shape having the second opening 32, and a first hollow pedestal of a plate shape having the first opening 31, which are configured to be stacked and secured in this order. Alternatively, the holder 30 may be manufactured to perform a drilling processing to a first surface 34 of the holder 30 to form the first opening 31 and further perform a drilling processing to a bottom surface of the first opening 31 to form the second opening 32.

The quantum chip 10 is flip-chip mounted on wiring layer 21 on the first surface of the interposer 20. The wiring layer 21 on the first surface has an outer peripheral portion excluding a mounting region of the quantum chip 10 in contact with the first opening bottom 35 (an outer peripheral portion of the second opening 32) of the holder 30.

The interposer 20 is housed in the first opening 31 of the holder 30. The quantum chip 10 which is flip-chip mounted on the wiring layer 21 on the first surface of the interposer 20, is housed in the second opening 32 of the holder 30. A gap may be provided between the second surface 12 of the quantum chip 10 and the second opening bottom 36 of the holder 30.

A predetermined gap may be also provided between a side surface of the interposer 20 and a side surface of the first opening 31.

Figure 2A:
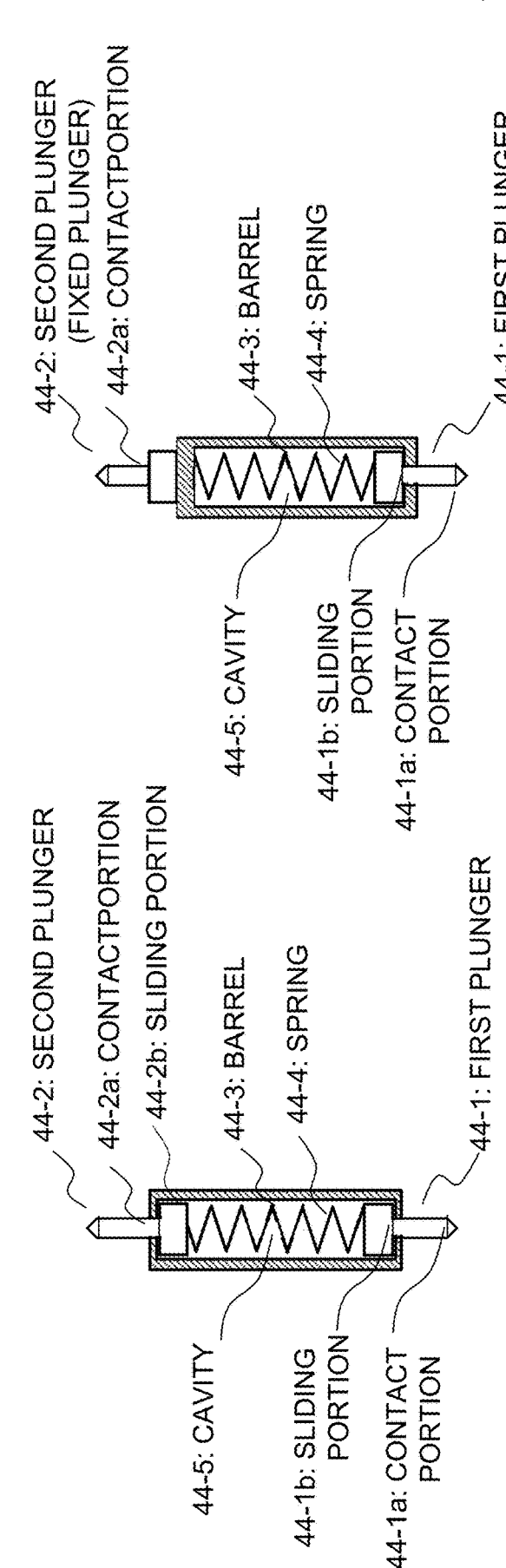
FIG. 2A are schematic cross-sectional views illustrating exemplary probe pins of both-ends movable type and one-end movable type.

FIG. 2A illustrates a probe pin 44 of both-ends movable type (left side) and a probe pin 44 of one-end movable type (right side). The probe pin 44 of both-ends movable type includes a barrel (pipe) 44-3 of hollow cylindrical and conductive, a first plunger 44-1 disposed at one end (first end) in a cavity 44-5 of an axial (longitudinal) direction of the barrel 44-3, a second plunger 44-2 disposed at the other end (second end) of the axial direction thereof, and a spring (coil spring) 44-4 that is housed in the cavity 44-5 of the barrel 44-3 and elastically biases the first and second plungers 44-1 and 44-2 in opposite axial directions. The first and second plungers 44-1 and 44-2 slide axially in the barrel 44-3. The first and second plungers 44-1 and 44-2 are configured to be provided with contact portions 44-1a and 44-2a and sliding portions 44-1b and 44-2b that slide within the cavity 44-5 of the barrel 44-3, respectively. An electric signal from one of the first and second plungers 44-1 and 44-2 is transmitted to the other plunder through the barrel 44-3. Tips of the contacting portions 44-1a and 44-2a of the first and second plungers 44-1 and 44-2 are illustrated as a convex shape, such as a cone shape or truncated cone shape, for simplicity, but the tip can be of triangular pyramid which makes good contact with a corresponding through hole. Alternatively, the tip can be of crown shape in which the tip are divided into four members of acute angles to have good contact performance, or be of cup shape or any other shape.

In the probe pin 44 of the one end movable type, the second plunger 44-2 is fixed to a top end of the barrel 44-3, and only the first plunger 44-1 slides axially in the cavity 44-5 of the barrel 44-3. The second plunger 44-2 is also referred to as a fixed plunger. The contact portion 44-2a of the second plunger 44-2 is not limited to a rod-shape, but may be a convex flat plate or a flat plate.

Figure 2B:
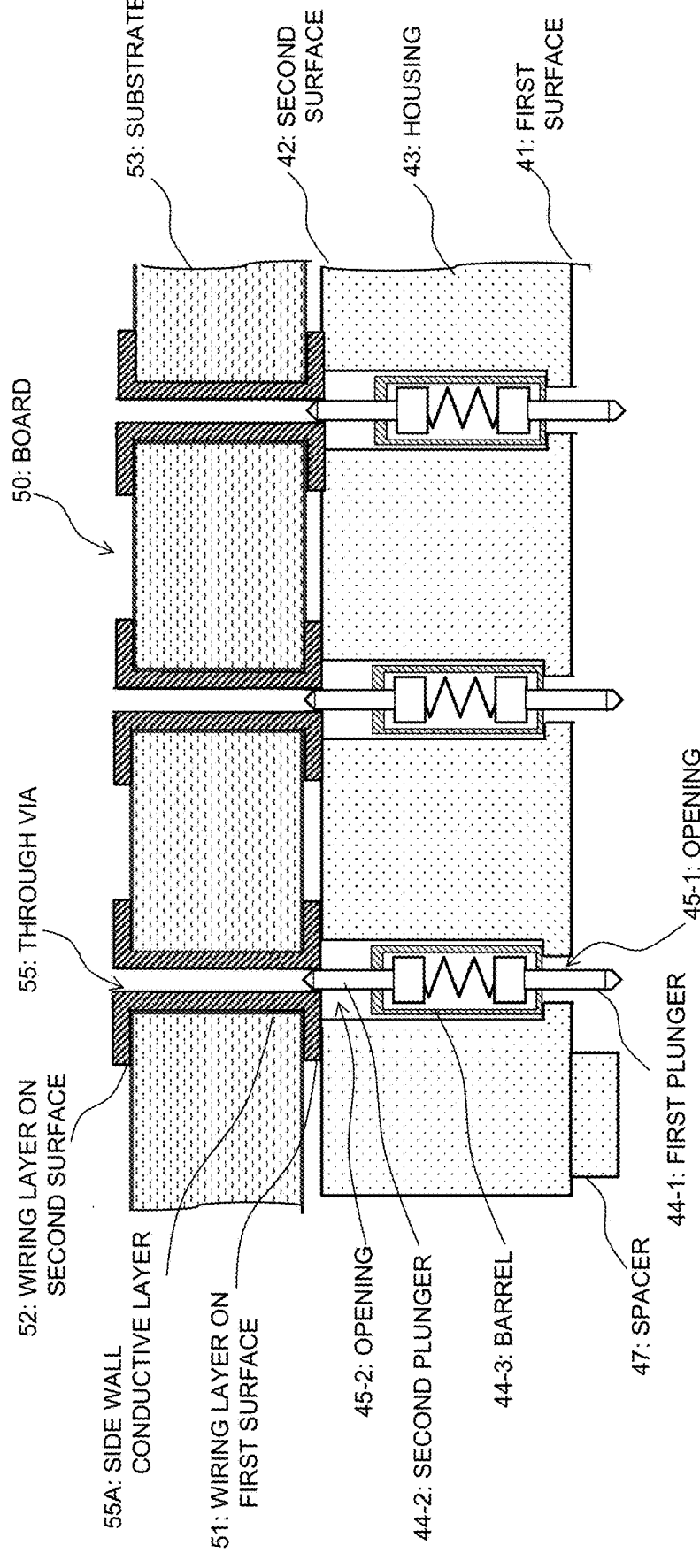
FIG. 2B is a schematic cross-sectional view illustrating an example of connection of the probe pin of the example of the disclosure.

FIG. 2B schematically illustrates an example of a connection between the probe pin 44 of the both-ends movable type illustrated in FIG. 1A and the wiring layer 51 on the first surface of the board 50. An opening 45 includes an opening 45-1 on the first surface 41 side of a housing 43 and an opening 45-2. The opening 45-2 has one end communicating with the opening 45-1 and the other end opened on the second surface 42 of the housing 43. The opening 45-2 has a diameter larger than that of the opening 45-1. The second plunger 44-2 (contacting portion 44-2a) of the probe pin 44 of the both-ends movable type is in contact with an opening end (via pad) of the through via 55 in the wiring layer 51 on the first surface of the board 50, in a state of being compressed in the axial direction. A tip of the contact portion 44-1a (FIG. 2A) of the first plunger 44-1 protruding from the opening 45-1 on the first surface 41 of the housing 43 is in contact with the terminal (pad) of the wiring layer 22 on the second surface of the interposer 20. The barrel 44-3 is housed within the opening 45-2 of the housing 43 and is held in a state that a lower end thereof is in contact with a lower end of the opening 45-2. A tip of the contact portion 44-2a (FIG. 2A) of the second plunger 44-2 protrudes from the opening 45-2 and is in contact with an opening end of the through via 55 of the wiring layer 51 on the first surface of the board 50. A diameter of a hole in the through via 55 is smaller than that of the second plunger 44-2 (contact portion 44-2a) of the probe pin 44. The first plunger 44-1 (contact portion 44-1a) of the probe pin 44 of the both-ends movable type is in contact with the terminal (pad) of the wiring layer 22 on the second surface of the interposer 20, in a state of being compressed in the axial direction. As a non-limiting example, a spacing (pitch) between neighboring probe pins 44 is about 0.3 mm, for example.

In the example illustrated in FIG. 2B, the second plunger 44-2 (contacting portion 44-2a) of the probe pin 44 is in contact with the opening end (via pad) of the through via 55 in the wiring layer 51 on the first surface of the board 50. However, the second plunger 44-2 may be in contact with the terminal (wiring pad, etc.) of the wiring layer 51 on the first surface of the board 50 and connected via a wiring to a different through via 55 at a location different from the contact point. The through via 55 may be a filled via which is a closed via hole filled with a conductive material(s). When the housing 43 is made of a conductive material(s), an inner wall of each of the openings 45-1 and 45-2 and bottoms of the openings is covered with an insulating material. The insulating material may be resin. Alternatively, it may be ceramic in consideration of insulation, mechanical strength and workability.

In the example illustrated in FIG. 2B, the wiring layer 51 (including a via pad of the through via 55) on the first surface of the board 50 is in contact with the second surface 42 of the housing 43. However, in a case where the board 50 is supported by a support member or the like (not shown) on the first surface side to ensure a gap relative to the housing 43, the wiring layer 51 (including the via pad of the through via 55) on the first surface of the board 50 may be separated from the second surface 42 of the housing 43. In a case where the substrate 53 is configured with a multilayer substrate such as a build-up substrate, as the through via 55 (through hole via), there may be provided a blind via which is in contact with the second plunger 44-2 (contacting portion 44-2a) of the probe pin 44 at the first surface and has an end connected via wiring to a different via which is connected to the wiring layer 52 on the second surface through multiple other vias. The blind via is in contact with the second plunger 44-2 (contacting portion 44-2a) of the probe pin 44 at the first surface. Alternatively, the through via 55 may be a stack via with multiple vias stacked to each other.

With the socket 40 that houses the probe pin 44 of the both-ends movable type in the housing 43, it is possible to absorb a variation of a gap between the interposer 20 and the board 50 in assembling. Thereby, it is possible to eliminate contact failure caused by deformation due to differences in linear expansion coefficient during cooling from a room temperature to an extremely low temperature, as a result of which connection reliability can be ensured. That is, the first and second plungers 44-1 and 44-2 of the probe pin 44 are in contact with the terminal of the wiring layer 51 on the first surface of the board 50 and the terminal of the wiring layer 22 on the second surface of the interposer 20, respectively, in an axially compressed state. This means that the first and second plungers 44-1 and 44-2 are under compressive pressure to press on the spring 44-4 in the cavity 44-5 of the barrel 44-3. As a result, the probe pin can autonomously respond to (cope with) variation in gap due to deformation of the interposer 20 and the board 50. As an arrangement of probe pins 44, the ground terminal of the wiring layer 22 on the second surface of the interposer 20 and the ground terminal of the wiring layer 51 on the first surface of the board 50 may be located in a vicinity of the probe pin 44 for signal transmission. In FIG. 2B, a use of the probe pin 44 of the both-ends movable type is explained as an example, but this, as a matter of course, does not preclude a use of a probe pin of a one-end movable type.

Figure 3A:
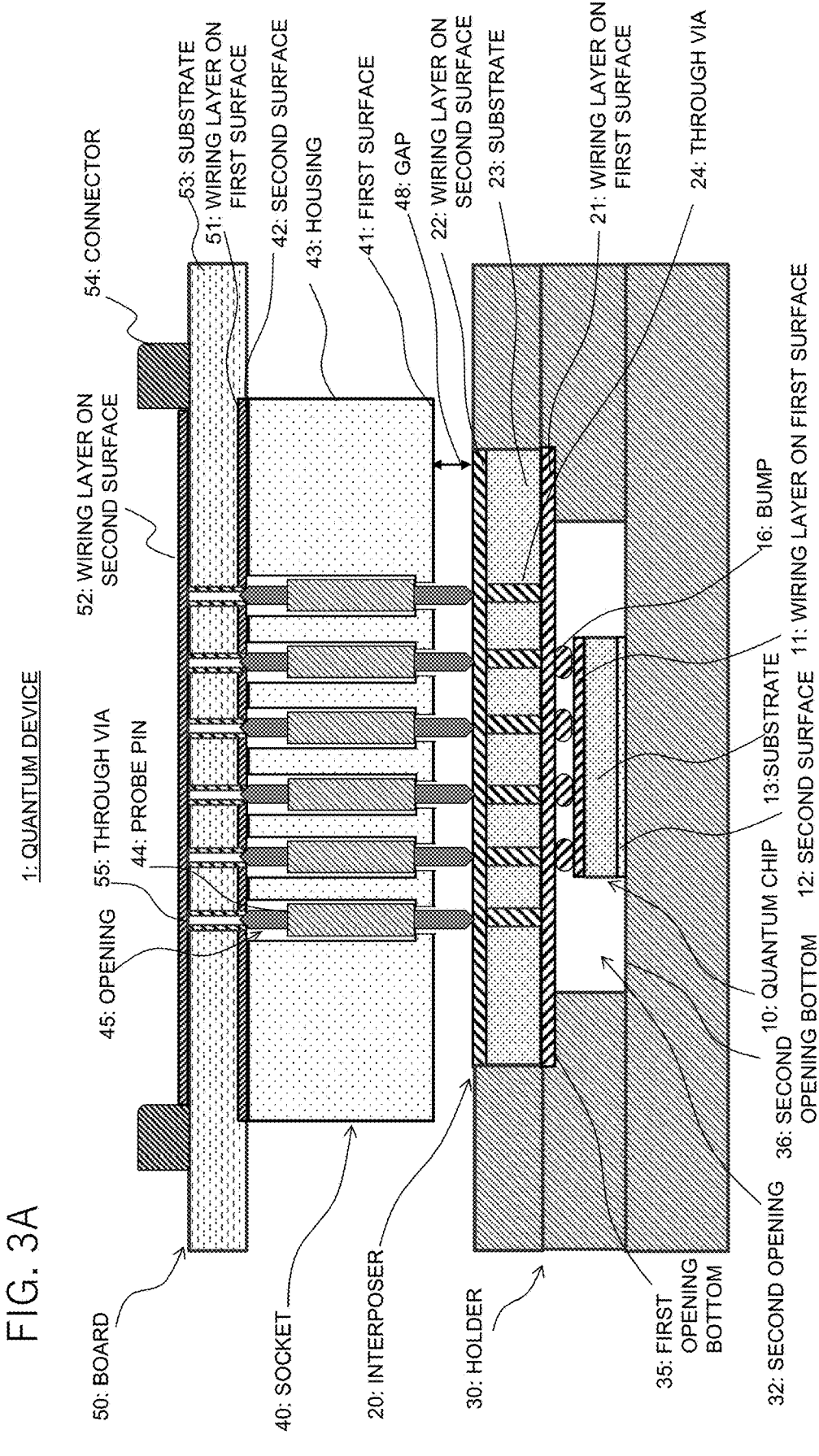
FIG. 3A is a schematic cross-sectional view illustrating a comparative example.

FIG. 3A illustrates a configuration of a comparative example without the spacer 47. In FIG. 3A, when cooling to an extremely low temperature, a situation can occur where the socket 40 may tilt, s illustrated in FIG. 3B, due to an accumulated error and differences in the linear expansion coefficient of multiple members, and an electrical connection by the probe pin 44 cannot be secured. That is, a clearance between the socket 40 and the wiring layer 22 on the second surface of the interposer 20 cannot be ensured, resulting in unstable contact of the probe pin 44 or disconnection. Impedance mismatch in a high-frequency signal due to change of a distance between a signal conductor and a dielectric. When a contact state between the probe pin 44 and the terminal of the wiring layer 22 on the second surface of the interposer becomes poor (or defective), Joule heat due to contact resistance can be generated and superconductivity cannot be maintained. That is, the probe pin 44 is in contact (tight contact) with the spring 44-4 (FIG. 2A) in the barrel, which is compressed and the tip of the first plunger 44-1 is pressed against the terminal of the wiring layer 22 on the second surface of the interposer 20. However, as the distance (or space) between the socket 40 and the interposer 20 increases, adhesion between the tip of the first plunger 44-1 and the terminal of the wiring layer 22 on the second surface of the interposer 20 loosens. This increases a contact resistance as compared with a direct metal-to-metal contact.

In FIG. 3A, since there is no place to support an upper layer above the socket 40, slanted mounting or disconnection of electrical connections may occur due to an accumulated error caused by combination of multiple members and due to differences in the linear expansion coefficient, etc., at a low temperature. In the example illustrated in FIG. 3B, the socket 40 is tilted and the plungers of two probe pins 44 on the right side are off from the interposer 20.

As a non-limiting example, the size of probe pin 44, for example, may preferably be a combination of a diameter of 0.5 mm or less and a length (height) of about 3 mm or less. More preferably, the diameter may be 0.3 mm or less and the length should be 2.5 mm or less. Even more preferably, the diameter may be 0.2 mm or less and the length should be 2 mm or less. Using such a probe pin 44 and under condition that an effective range of movement (full stroke) of the probe pin 44 between the interposer 20 and the socket 40 is about a hundred and several tens of micrometers, it is necessary to press the plungers of the probe pins 44 against the terminals of the interposer 20 while keeping the gap (space) 48 between interposer 20 and socket 40, for example, at a few (or several) tens of micrometers. Regarding the gap 48 between the interposer 20 and the socket 40, as long as within the design tolerance, the larger, the more desirable.

Figure 3B:
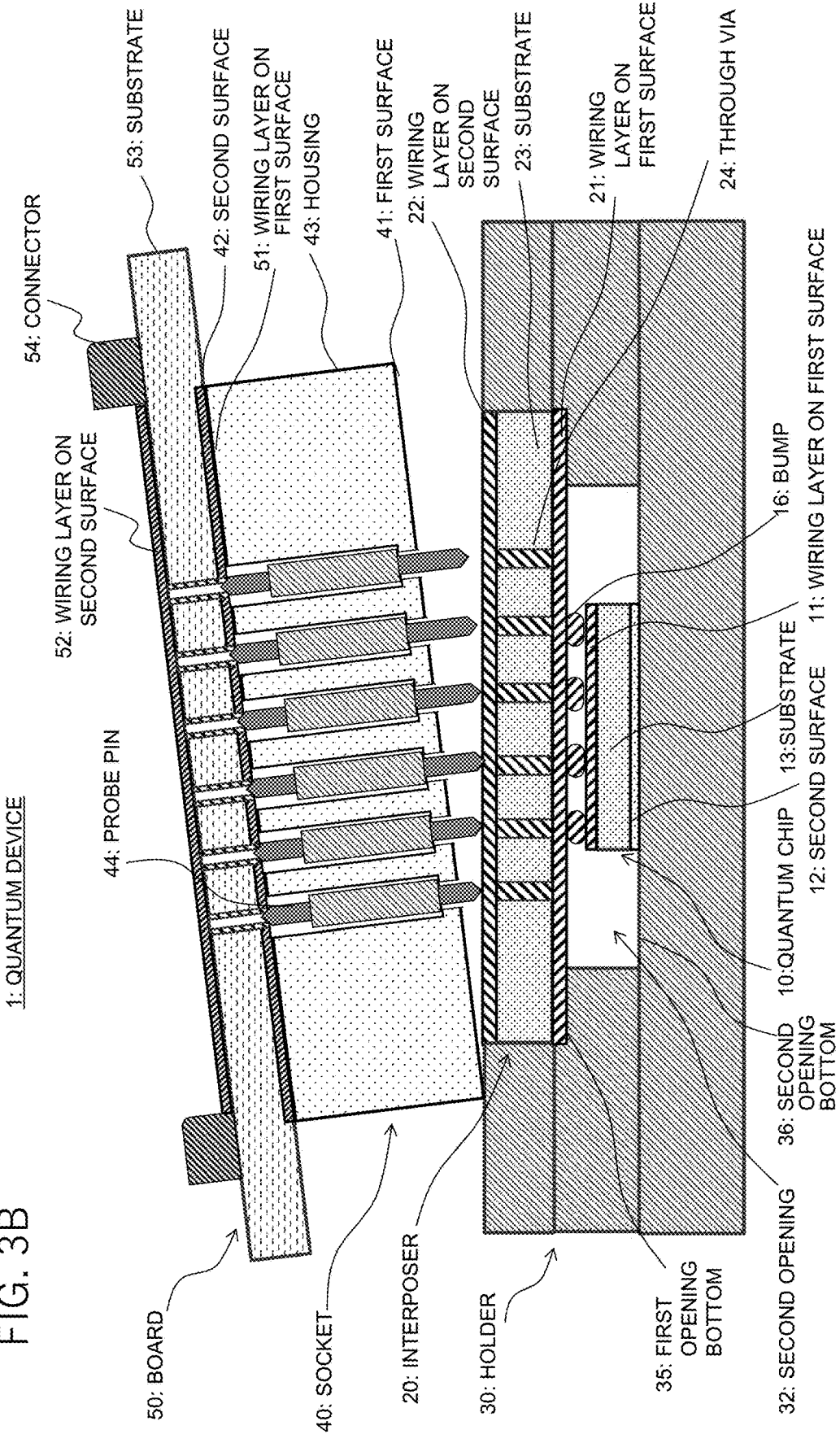
FIG. 3B is a schematic perspective view illustrating the comparative example.

According to the present example of the disclosure, the quantum chip 10 is housed in the second opening 32 of the holder 30 that can be cooled to an extremely low temperature, and the interposer 20 is housed in the first opening 31 of the holder 30. An outer circumference (peripheral) region of the wiring layer 21 on the first surface of the interposer 20 is in contact with the first opening bottom (shoulder) 35 of the holder 30. With the spacer 47 to maintain a constant clearance (space) between the wiring layer 22 on the second surface of the interposer 20 and the first surface 41 of the housing 43, the clearance is ensured according to a height of the spacer 47. Furthermore, it is possible to stabilize a contact of the probe pin 44 with a corresponding terminals of the wiring layer 22 on the second surface of the interposer 20. The spacer 47 also can contribute to suppress the socket 40 from being mounted (tilting) obliquely with respect to the interposer 20, as illustrated in FIG. 3B. Therefore, the quantum device 1 according to the present example of the disclosure is enabled to control an impedance of a signal line by making a distance between a signal conductor (e.g., a signal terminal of the wiring layer 22 on the second surface of the interposer 20 with which the probe pin 44 for signal transmission is in contact) and a dielectric (e.g., the housing 43) uniform for each probe pin 44.

The present example of the disclosure enables to maintain the space between the socket 40 and the interposer 20 and to suppress of the tilting of the socket. It also enables to ensure an impedance matching of the signal line of the probe pins 4 when the probe pin electrically connected in the signal line.

Furthermore, the socket 40 is in contact with the interposer 20 housed in the first opening 31 of the holder 30 through the spacer(s) 47. This enables to improve the cooling effect around the socket 40.

FIG. 4 is a schematic cross-sectional view illustrating a variation of the example of the disclosure. In FIG. 4, the same or equivalent elements as those illustrated in FIG. 1A are assigned to the same reference numerals. In the following, explanation of elements identical to those illustrated in FIG. 1A will be omitted and differences will be described. Referring to FIG. 4, the quantum device 1 includes a positioning pin(s) 46 fitted into an opening 56 of the board 50 at an outer periphery of the second surface 42 of the housing 43. The positioning pin(s) 46 may be provided, for example, at each of the four corners of the second surface 42 of the housing 43. The positioning pin(s) 46 may also be provided at each of two opposite corners of the second surface 42 of the housing 43. A planar shape of the positioning pin 46 may be any one of column (e.g., round column, rectangular column, triangular column, other column), cone, and frustum. An opening(s) 56 of the board 50 is opened to a shape corresponding to a shape of the positioning pin(s) 46 by a drill, etc. The positioning pin 46 may be integrally formed with the housing 43. At the time of mounting, the opening(s) 56 of the board 50 is/are aligned with the positioning pin(s) 46 which are inserted into the opening(s) 56 of the board 50, which contributes to improvement of an arrangement accuracy and also prevents misalignment of the board 50 and the socket 40 during cooling to an extremely low temperature.

FIG. 5A illustrates other examples of arrangements and planar shapes of the at least one spacer 47 on the first surface 41 of the housing 43. In FIG. 5A, (a) corresponds to the configuration illustrated in FIG. 1C. In FIG. 5A, reference numerals other than the spacer 47 are omitted on and after (b). In FIG. 5A, followings are illustrated as the planar shapes of the spacer 47 arranged at each of the four corners of the first surface 41 of the housing 43.

(b) Square;

(c) Polygon;

(d) Round;

(e) Ellipse: with a major axis of the Ellipse inclined at 45 degrees to two orthogonal sides at each corner(s) of the housing 43, and an extension line of a minor axis thereof intersecting with the corner of the housing 43;

(f) L-shape: with two sides of the L-shape arranged parallel to two orthogonal sides at each corner of the housing 43;

(g) Track shape 1 (round tip type): with a longitudinal direction arranged at 45 degrees angle to two orthogonal sides at each corner of the housing 43;

(h) Track shape 2 (round tip type): with a longitudinal direction at each corner of the housing 43 arranged in a diagonal direction of the housing 43;

(i) Track shape 3 (round tip type): with an orientation of the adjacent (preceding) track shape 3 at each corner of the housing 43 so as to be rotated 90 degrees from an orientation of the adjacent (preceding) track shape 3 at the adjacent (preceding) corner.

The shape of the spacer 47 is, of course, not limited to the above.

Figure 5B:
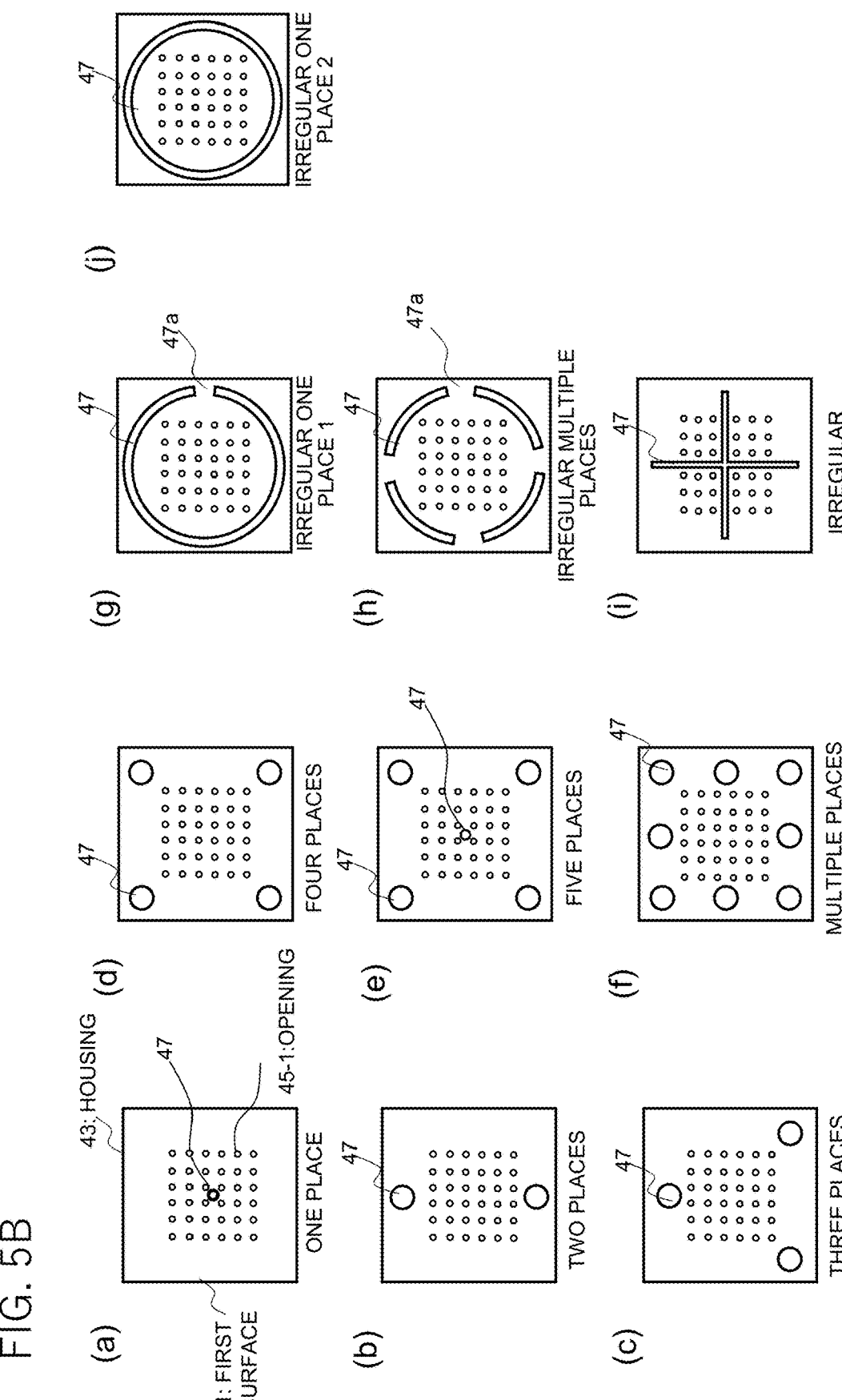
FIG. 5B illustrates variation of the example of the disclosure.

FIG. 5B illustrates various variations of placement patterns of the spacer(s) 47 from the viewpoint of the number of spacer(s) 47 regarding to arrangements and planar shapes of the spacer(s) 47 on the first surface 41 of the housing 43. In FIG. 5B, the pattern (d) corresponds to the pattern (d) of FIG. 5A.

In FIG. 5B, following placement patterns are illustrated.

(a) A single spacer 47 is arranged in one central location of the first surface 41 of the housing 43;

(b) Two spacers 47 are arranged on a centerline of the first surface 41 of the housing 43 above and below (centerline being vertical in the illustration);

(c) Three spacers 47 are arranged at each vertex of a triangle formed by two corners and a center of the side opposite the side formed by the two corners of the first surface 41 of the housing 43;

(d) Four spacers 47 are arranged at the four corners of the first surface 41 of the housing 43, respectively;

(e) Five spacers 47 are arranged so that four spacers 47 are arranged at the four corners of the first surface 41 of the housing 43, respectively, and one spacer 47 is arrange in one central location on the first surface 41 of the housing 43;

(f) Multiple spacers 47 are arranged around the perimeter of an array of openings 45-1 in the housing 43 (including the four corners of the first surface 41 of the housing 43);

(g) One ring-shaped spacer 47, which has a notch that serves as an air escape 47a, surrounding an array of openings 45-1 in the housing 43 (The air escape 47a is an escape hole for air evacuation during vacuum evacuation under a condition that the housing 43 is in contact with the wiring layer 22 on the second surface of the interposer 20.);

(h) Multiple arc-shaped spacers 47 surrounding an array of openings 45-1 in the housing 43 (The space between each arc serves as an air escape 47a);

(i) A cross-shaped spacer 47 provided with two straight lines extending vertically and transversely, respectively, of an array of openings 45-1 of the housing 43 and intersecting at a center of the array; and (j) One ring-shaped spacer 47 surrounding an array of openings 45-1 in housing 43.

The number and arrangement of the spacer(s) 47 is, as a matter of course, not limited to the above example. For example, in the placement patterns (g) and (j) of FIG. 5B, the spacer 47 may be a closed channel of square or polygonal type instead of a ring (circular ring). In the placement pattern (i) of FIG. 5B, the spacer 47 may be X-shaped provided with two straight lines extending in the diagonal directions, respectively, of the array of the openings 45-1 of the housing 43 and intersecting at the center of the array. Alternatively, the spacer 47 may be provided with two or more straight lines intersecting at the center of the array.

The following describes variations of configurations of the holder and the housing 43 with reference to from FIG. 6 to FIG. 15. In FIG. 6 to FIG. 15, the same reference numerals (or signs) are assigned to the same elements illustrated in FIG. 1A. In the following, description of elements identical to those illustrated in FIG. 1A will be omitted and differences from that illustrated in FIG. 1A will be described.

Figure 6:
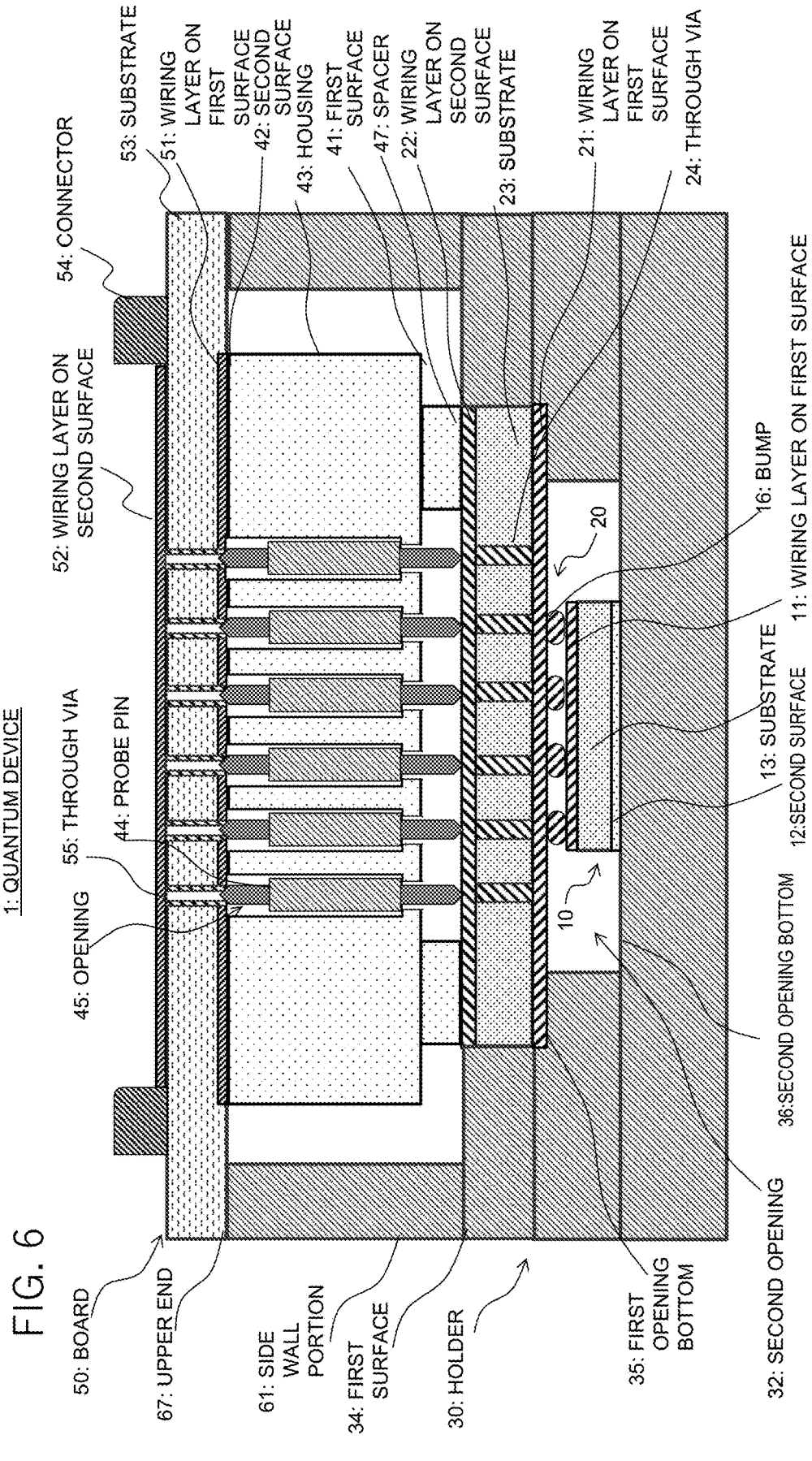
FIG. 6 is a schematic cross-sectional view illustrating a variation of the example of the disclosure.

Referring to FIG. 6, the quantum device 1 according to this variation further includes a side wall 61 between a first surface 34 of the holder 30 and a first surface of the board 50 to facilitate height control. The side wall 61 surrounds a side surface of the socket 40 with a predetermined gap. An outer peripheral portion of the first surface of the board 50 is in contact with an upper end 67 of the side wall 61 (side wall upper end) and thus supported by the side wall 61. The upper end 67 of the side wall 61 is the same height as a second surface 42 of the housing 43 to facilitate height position control of the board 50. The side wall 61 is preferably made of the same material as the holder 30. The side wall 61 surrounding the sides surface of the socket 40 is disposed on the first surface 34 of the holder 30 (a top surface of the first hollow pedestal 30-1 illustrated in FIG. 1B). The socket 40 is housed within a space (cavity) defined by an inner wall of the side wall 61. Therefore, the side wall 61 may also be regarded as an element of the holder 30 as a fourth hollow pedestal that houses the socket 40 within the opening.

Referring to FIG. 7, the quantum device 1 according to this variation includes a side wall 61A on the first surface 34 of the holder so as to cover a part of the side surface of the housing 43. The side wall 61A facilitates control of a lateral position of the socket 40. A height of the side wall 61A is lower than the side wall 61 illustrated in FIG. 6 and its (wall) thickness is greater than the side wall 61 and is defined to be in contact with the side surface of the housing 43. However, there may be an allowance (tolerance) between an inner circumference of the side wall 61A and the side surface of the housing 43 to facilitate accommodating of the socket 40. In this variation, deformation or tilting of the socket 40 due to cooling to extremely low temperature can be prevented. The side wall 61A is preferably made of the same material as the holder 30.

Referring to FIG. 8A, the quantum device 1 according to this variation includes a side wall 61B on the first surface 34 of the holder so as to cover the side surface of the housing 43. A height of the side wall 61B is the same height as the side wall 61 illustrated in FIG. 6. The board 50 is placed on an upper end 67 of the side wall 61B. A (wall) thickness of the side wall 61B is the same as that of the side wall 61A illustrated in FIG. 7 and is defined to be in contact with the side surface of the housing 43. According to this variation, height control and lateral position control are facilitated. In addition, heat dissipation performance to the holder 30, such as cooling of the quantum chip 10, is improved. The side wall 61B is preferably made of the same material as the holder 30.

Figure 8B:
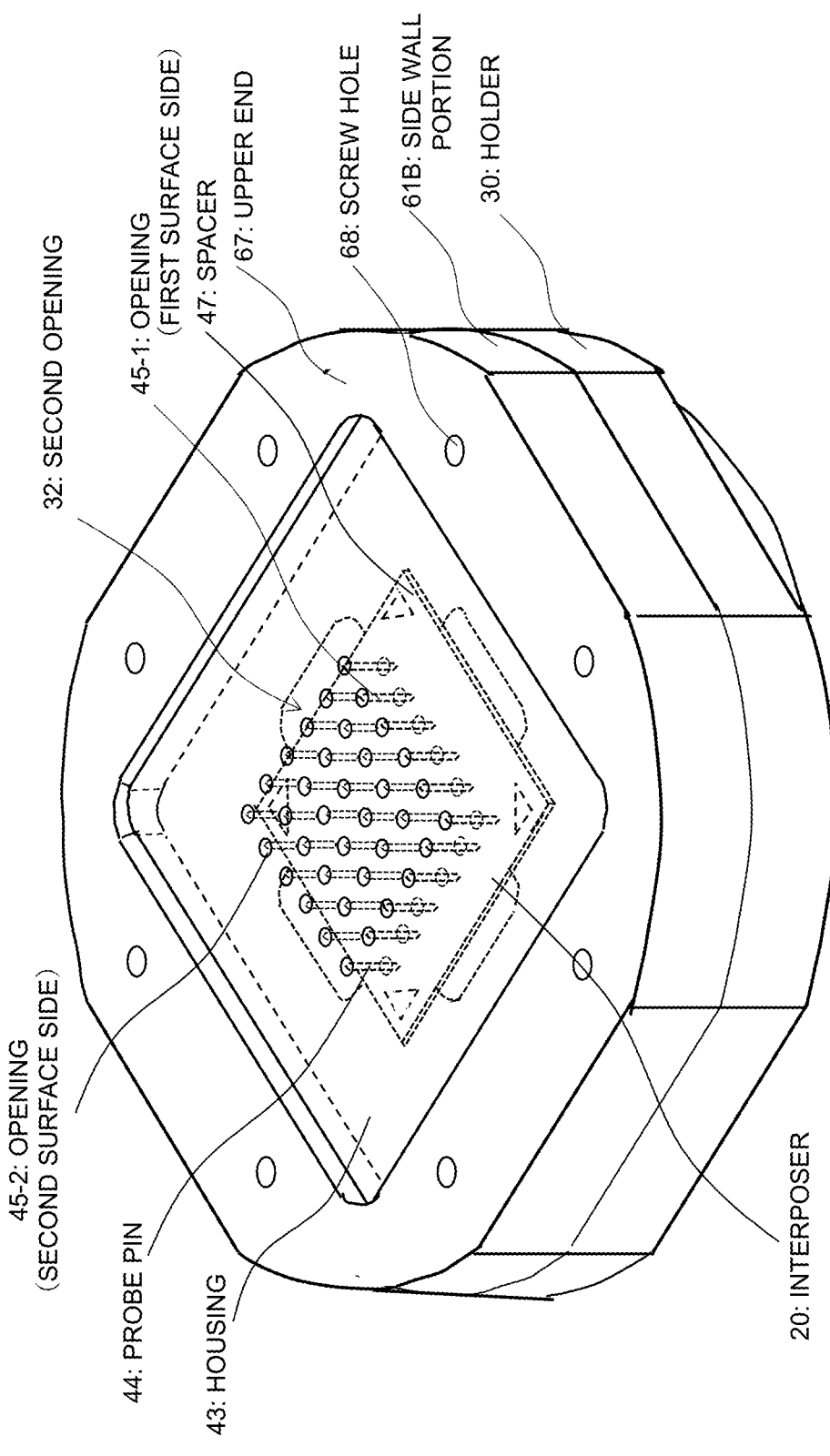
FIG. 8B is a schematic perspective view illustrating the variation illustrated in FIG. 8A.

FIG. 8B is a perspective view schematically exemplifying a configuration illustrated in FIG. 8A. In FIG. 8B, the spacers 47 on the first surface 41 of the housing 43 are configured as illustrated in FIG. 1C. The upper end 67 of the side wall 61B is to be a top surface of the holder 30 and the board 50 is placed thereon. As a non-limiting example, in an example illustrated in FIG. 8B, the upper end 67 of the side wall 61B includes screw holes 68 to fix the side wall 61B to the holder 30, for example. As a non-limiting example, in an example illustrated in FIG. 8B, four corners of an opening (cavity in which the socket 40 is housed) configured with an inner wall of the side wall 61B are formed as rounded corners. In FIG. 8B, the openings 45-2 on the second surface side of the housing 43 are illustrated with the socket 40 housed in the opening configured with the inner wall of the side wall 61B. Also, the probe pins 44, the openings 45-1 on the first surface 41 side, the spacers 47, the interposer 20 which is in contact with the spacer 47, and the second opening 32 directly below the interposer 20 are illustrated in a schematic perspective view.

FIG. 8C is a schematic see-through perspective view of the socket illustrated in FIG. 8B. As a non-limiting example, four corners of the housing 43 are rounded corners.

Figure 8D:
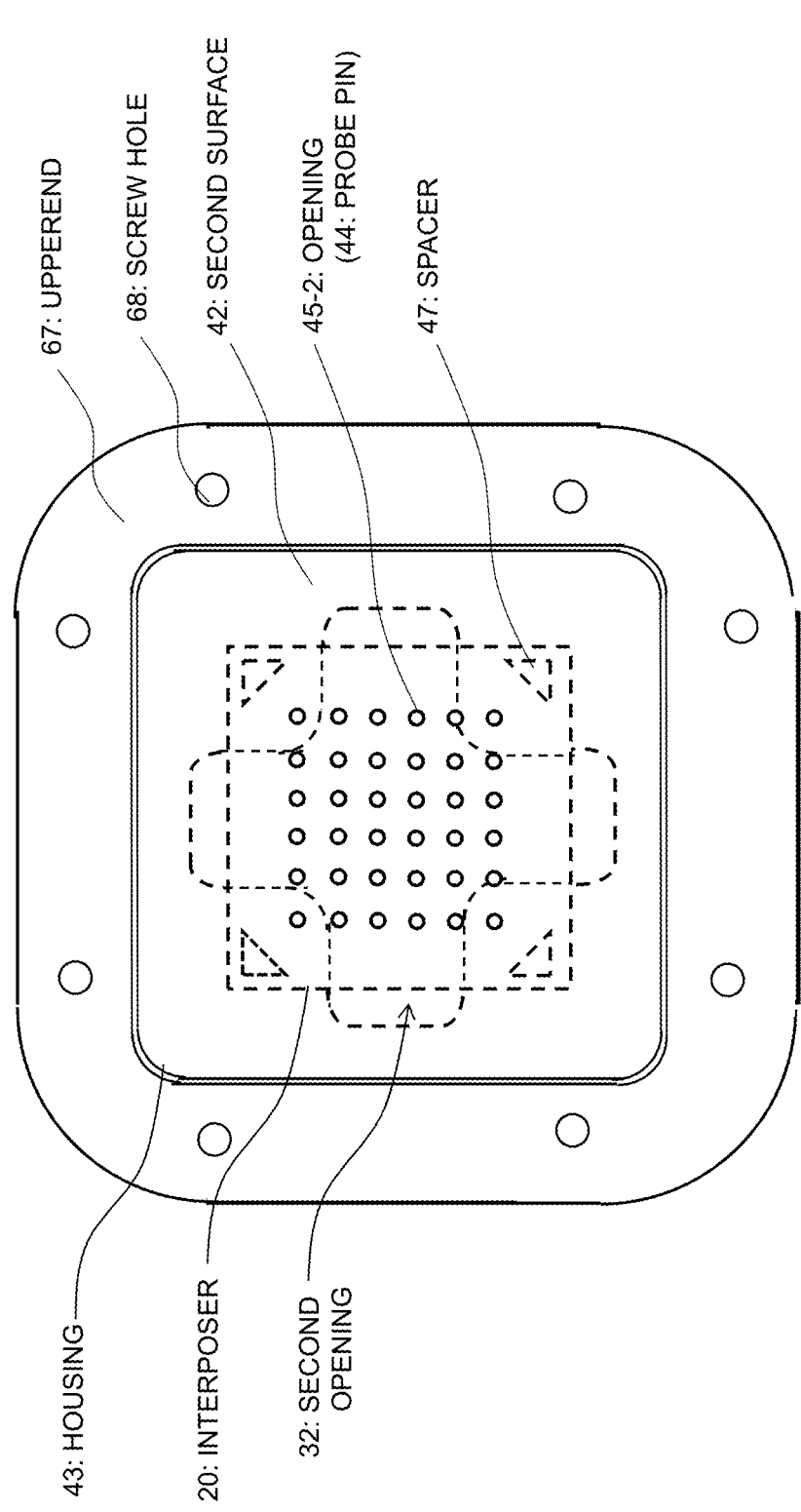
FIG. 8D is a schematic plan view illustrating the variation illustrated in FIG. 8A.

FIG. 8D is a schematic plan view of FIG. 8B from above and corresponds to FIG. 1B. In FIG. 8D, the probe pin 44 is housed in the opening 45-2 on the second surface 42 of the housing 43, as illustrated in FIG. 8C, but the probe pin 44 has been omitted for the sake of simplicity of the drawing. The planar shape of the second opening 32 of the holder 30 is cross-shaped. The wiring layer 22 of the first surface of the interposer 20 is in contact with an outer periphery portion of the second opening 32 at the first opening bottom 35 of the holder 30.

Referring to FIG. 9, the quantum device 1 according to this variation includes a support member 62A, which supports an outer periphery portion of the first surface 41 of the housing 43 from below, on the first surface 34 of the holder 30. The spacer 47 of the first surface 41 of the housing 43 is configured to be in contact with the second surface of the interposer 20, and the outer periphery portion of the first surface 41 of the socket 40 is configured to be in contact with a top surface of the support member 62A. This configuration contributes to stabilizing a position of the socket 40 when cooled from a room temperature to an extremely low temperature. The support member 62A is disposed on an outer periphery relative to the spacer 47 on the first surface 41 of the socket 40. This variation may facilitate height control of the socket 40.

Figure 10:
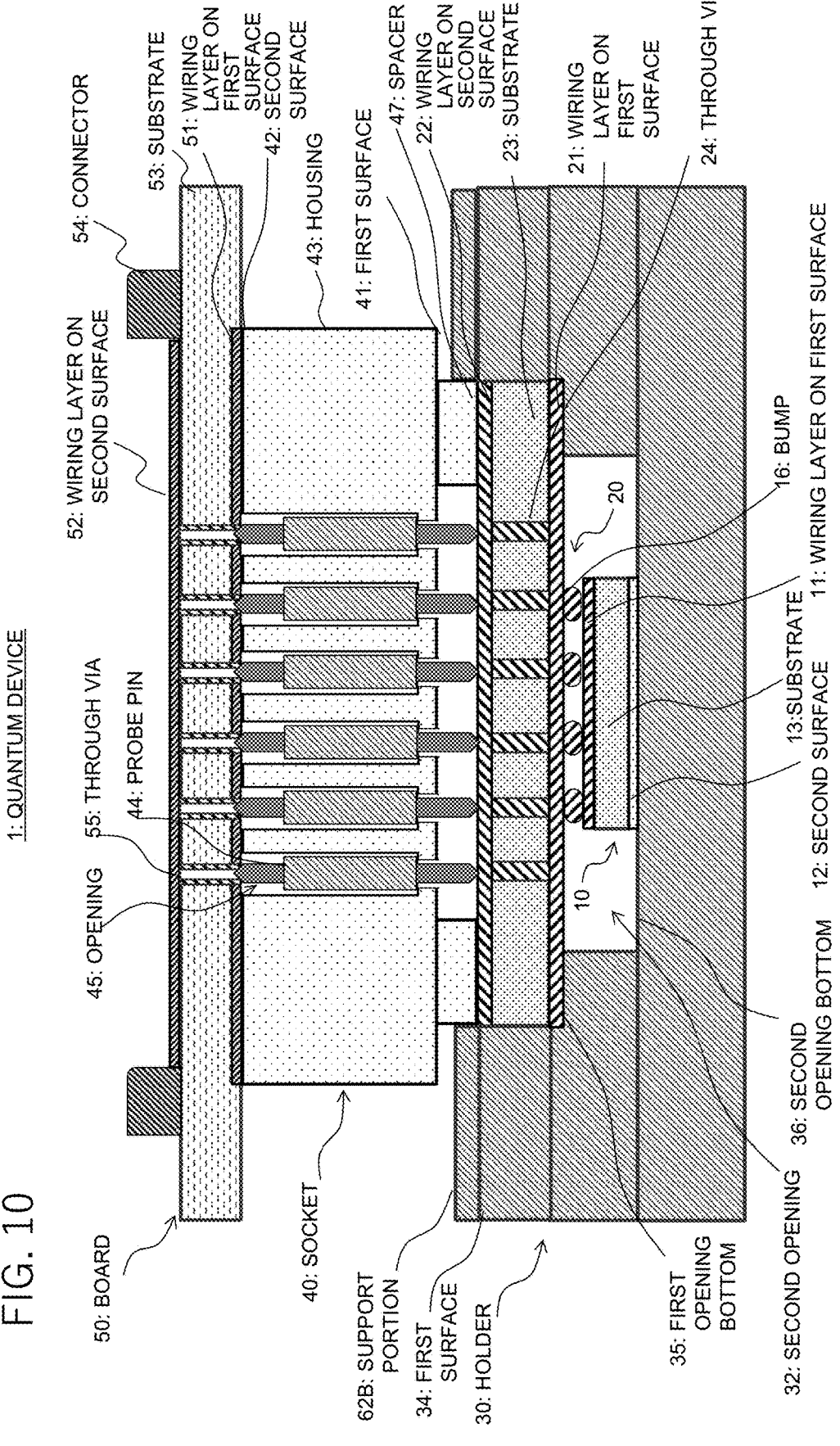
FIG. 10 is a schematic cross-sectional view illustrating a variation of the example of the disclosure.

Referring to FIG. 10, the quantum device 1 according to this variation includes a support member 62B which is in contact with a portion of a side surface of the spacer 47 on the first surface 41 of the housing and laterally supports the spacer 47, on the first surface 34 of the holder 30. The support member 62B is also termed as a guide (guiding portion) because it functions to guide a lateral position of the spacer 47 in assembling. A height of the support member 62B is lower than that of the spacer 47. That is, the height of the support member 62B is smaller than a space between the wiring layer 22 on the second surface of the interposer 20 and the first surface 41 of the housing 43 and is lower than the height of the support member 62 A illustrated in FIG. 9. A width (lateral length) of the support member (guide) 62B is larger than the width of the support member 62A of FIG. 9. This variation facilitates control of lateral positioning of the socket 40. The side surface of the support member 62B is in contact with a part of the side surface of the spacer 47 while the spacer 47 of the first surface of the socket 40 is disposed on the second surface of the interposer 20. This configuration contributes to stabilizing a lateral position of the socket which is cooled from a room temperature to an extremely low temperature.

Figure 11:
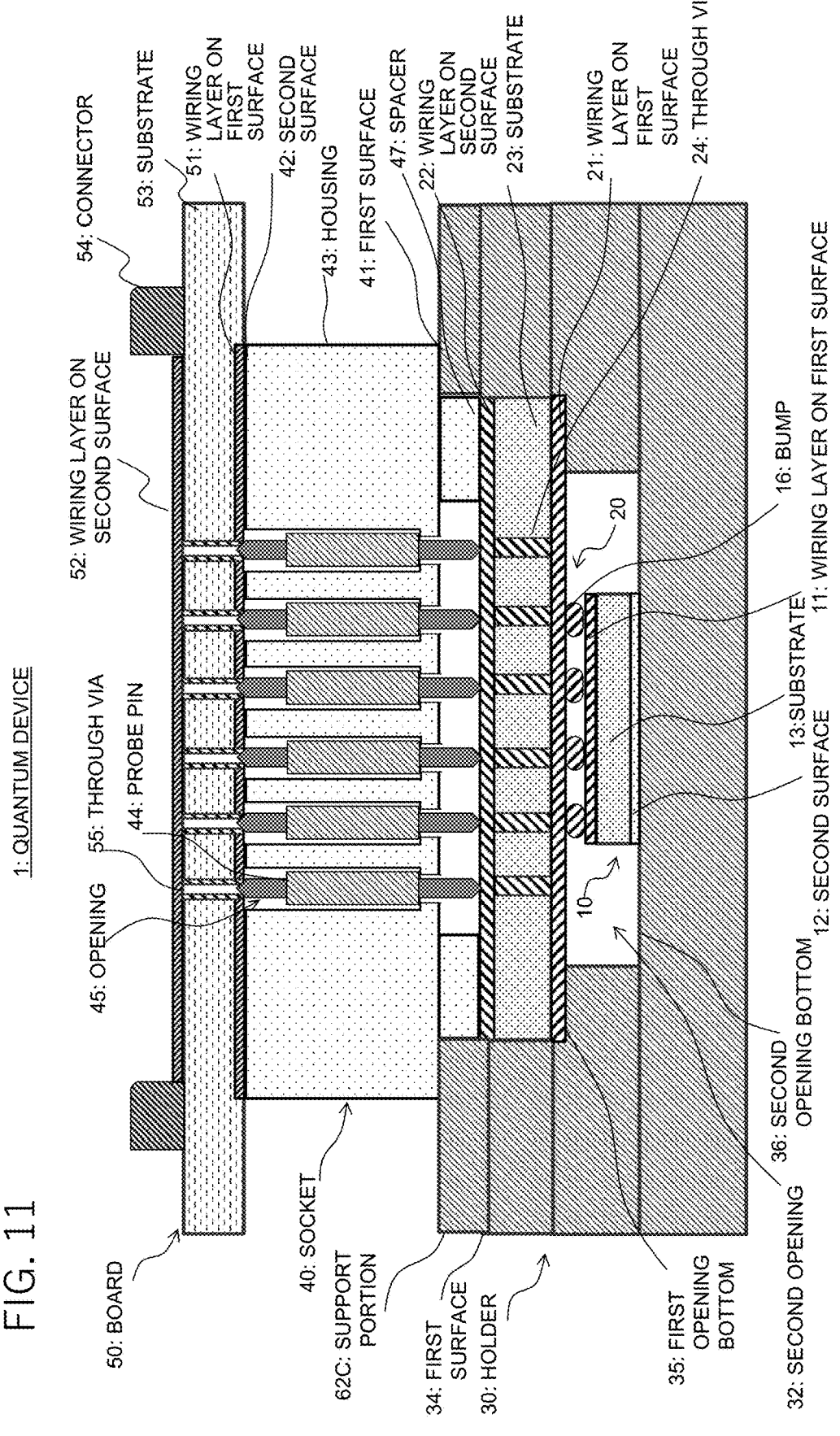
FIG. 11 is a schematic cross-sectional view illustrating a variation of the example of the disclosure.

Referring to FIG. 11, the quantum device 1 according to this variation includes a support member 62C which is in contact with an outer peripheral portion of the first surface 41 of the housing 43 and a side surface of the spacer 47 to guide the spacer 47, on the first surface 34 of the holder 30. The support member 62C is configured to raise the height of the support member 62B of FIG. 10 up to the first surface 41 of the housing 43 so that the outer peripheral portion of the first surface 41 is in contact with a top surface of the support member 62C, which facilitates height control and lateral position control of the socket 40.

Figure 12:
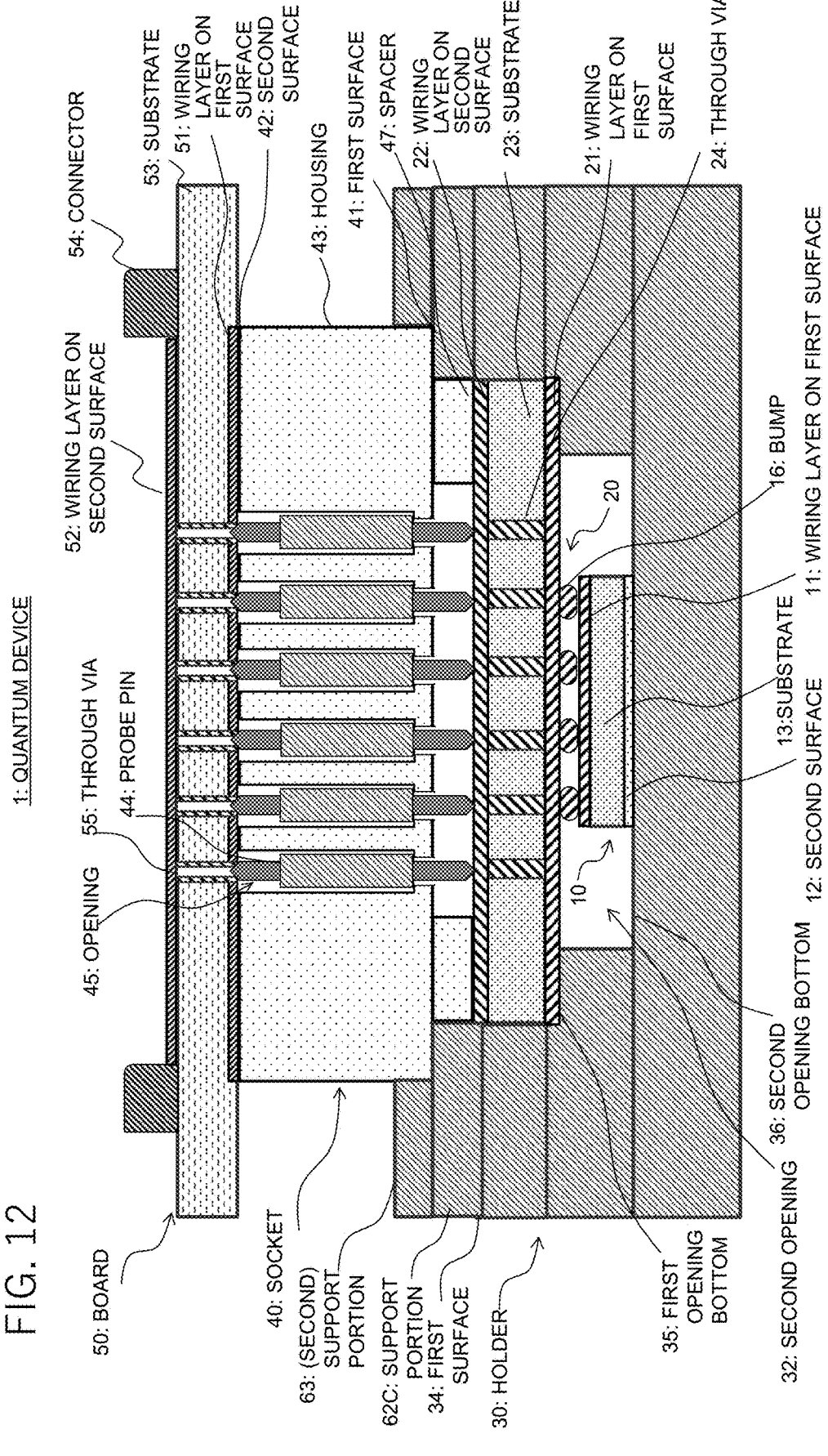
FIG. 12 is a schematic cross-sectional view illustrating a variation of the example of the disclosure.

Referring to FIG. 12, the quantum device 1 according to this variation includes a (second) support member 63 which laterally supports the socket 40, on the support member 62C of FIG. 11. A side surface of the support member 63 is in contact with a portion of a side surface of the housing 43. The support member 62C supports an outer peripheral portion of the first surface 41 of the housing 43 from below and also supports a side surface of the spacer 47. According to this variation, the support member 62C disposed on the first surface 34 of the holder 30 and the (second) support member 63 disposed on the top surface of the support member 62C facilitate height control of the socket and lateral position control of the socket 40.

Figure 13:
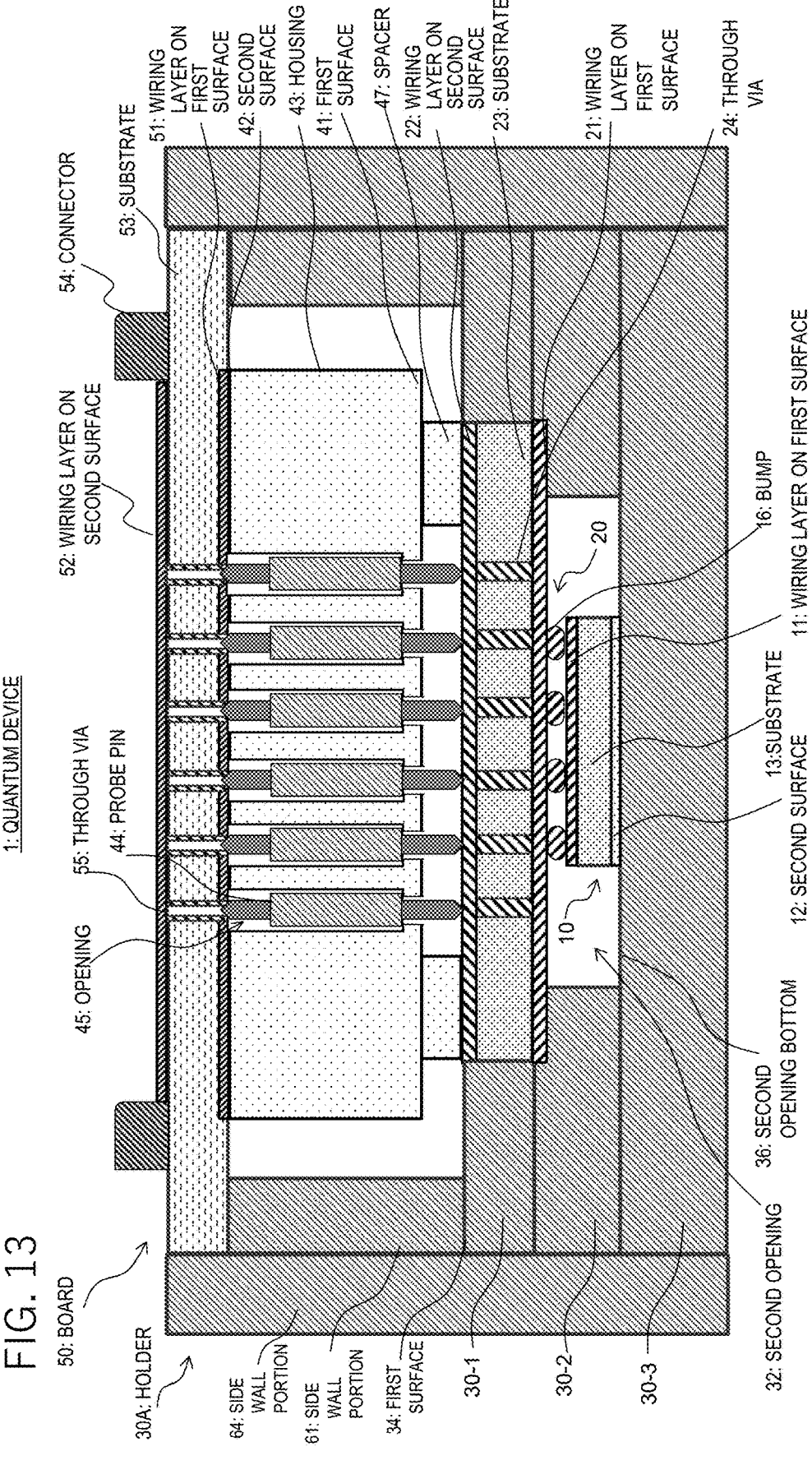
FIG. 13 is a schematic cross-sectional view illustrating a variation of the example of the disclosure.

Referring to FIG. 13, the holder 30 according to this variation includes a side wall 64 that surrounds the side wall 61 illustrated in FIG. 6, the bases 30-1, 30-2 and 30-3 of the holder 30 illustrated in FIG. 1B, and a side surface of the board 50. That is, the board 50 is positionally controlled in the height direction by the side wall 61 and in the lateral direction by the side wall 64. In the example illustrated in FIG. 13, the holder 30A and the board 50 are integrated.

Referring to FIG. 14, the quantum device 1 according to this variation further includes a support mechanism 65 and a support member 66 on an upper end (top surface) of the side wall 64 of FIG. 13. The support member is attached to the support mechanism 65 and supports the board 50 from above to control a height and lateral position of the board 50. The support mechanism 65 may be configured to movably support the support member 66. For example, when placing the board 50 on the socket 40, the support member 66 may be configured to slide laterally against the support mechanism 65 to provide a sufficient lateral space for the board 50 to be placed on the top edge (top surface) of the side wall 61. After the board 50 is placed on the second surface 42 of the socket 40 and the top edge (top surface) of the side wall 61, the support member 66 may be configured to slide so as to cover a portion of the edge of the second face of the board 50 to latch (lock) the board 50. Alternatively, the support member 66 may be provided with a mechanism to rotate about 90 degrees (clockwise or counterclockwise) relative to the support mechanism 65 to provide a lateral space equivalent to the board 50. In this case, the support member 66 may be rotated about 90 degrees (counterclockwise or clockwise) and then be locked to cover the edge of the second surface of the board 50 partially, after the board 50 is placed on the second surface 42 of the socket 40 and the upper end (top surface) of the side wall 61. A set of support mechanism 65 and support member 66 disposed on the upper end (top surface) of the side wall 64 may be provided corresponding to each of relative sides of the second surface of the board 50 or may be provided in positions corresponding to each of four corners of the second surface of the board 50.

Referring to FIG. 15, a top surface of the first hollow pedestal 30-1 of the holder 30 does not reach the wiring layer 22 on the second surface of the interposer 20, and an edge (outer peripheral portion) of the second surface of the interposer 20 is in contact with a concave portion of the spacer 47. That is, the spacer 47 has a step difference for which a lower right portion (as viewed on an illustrated paper plane) in the cross section of its rectangular shape is cut off, and an end of the wiring layer 22 on the second surface of the interposer 20 is in contact (fitted) with a step difference portion of the spacer 47. This variation contributes to facilitate lateral and longitudinal position control of the socket 40 relative to the interposer 20.

The following describes examples of the interposer 20 and the quantum chip 10 placed on/in the holder 30 with reference to FIG. 16A to FIG. 23. In the variations in FIG. 16A to FIG. 23, the socket 40 is placed on the wiring layer 22 of the second surface of the interposer 20 through the spacer(s) 47, as illustrated in FIG. 1A and other examples, and the board 50 is placed on the second surface 42 of the socket 40. In FIG. 16A to FIG. 23, the same reference numerals (or signs) are assigned to the same elements illustrated in FIG. 1A and other figures, and detailed descriptions thereof are omitted as appropriate.

Figures 16A, 16B:
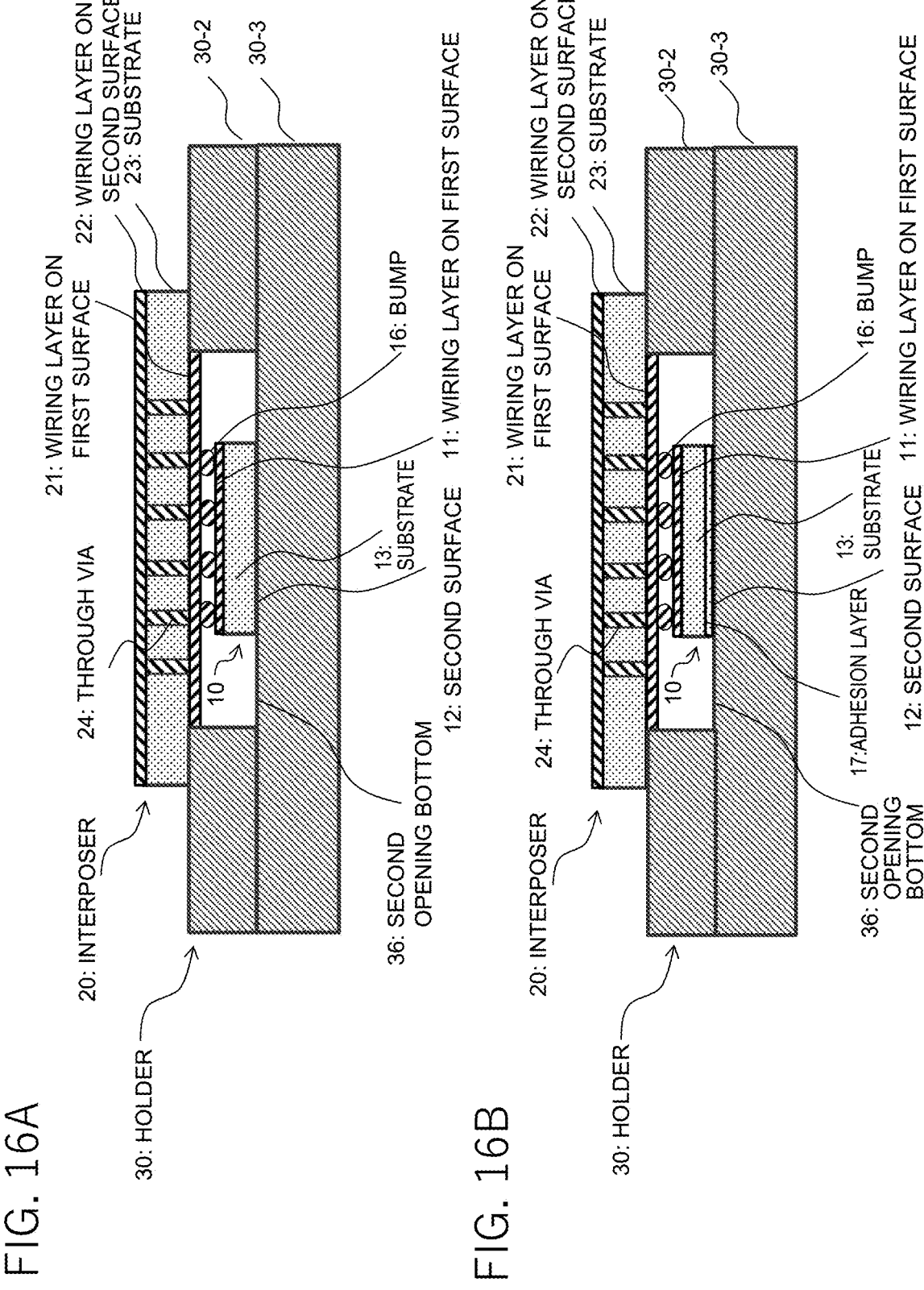
FIG. 16A and FIG. 16B are schematic cross-sectional views illustrating variations of the example of the disclosure.

Referring to FIG. 16A, an outer peripheral portion of the first surface of the interposer 20 is in contact with a top surface of the second hollow pedestal 30-2. The second surface 12 of the quantum chip 10, which is mounted on the wiring layer 22 on the first surface of the interposer 20 with the wiring layer 11 on the first surface of the quantum chip 10 facing thereto, is not bonded to the second opening bottom 36 of the holder 30.

Referring to FIG. 16B, the second surface 12 of the quantum chip 10 is fixed to the second opening bottom 36 of the holder 30 by adhesion, bonding or the like. When fixing the second surface 12 of the quantum chip 10 to the second opening bottom 36 by adhesion, varnish or grease may be used as an adhesion layer 17.

Figures 17A, 17B:
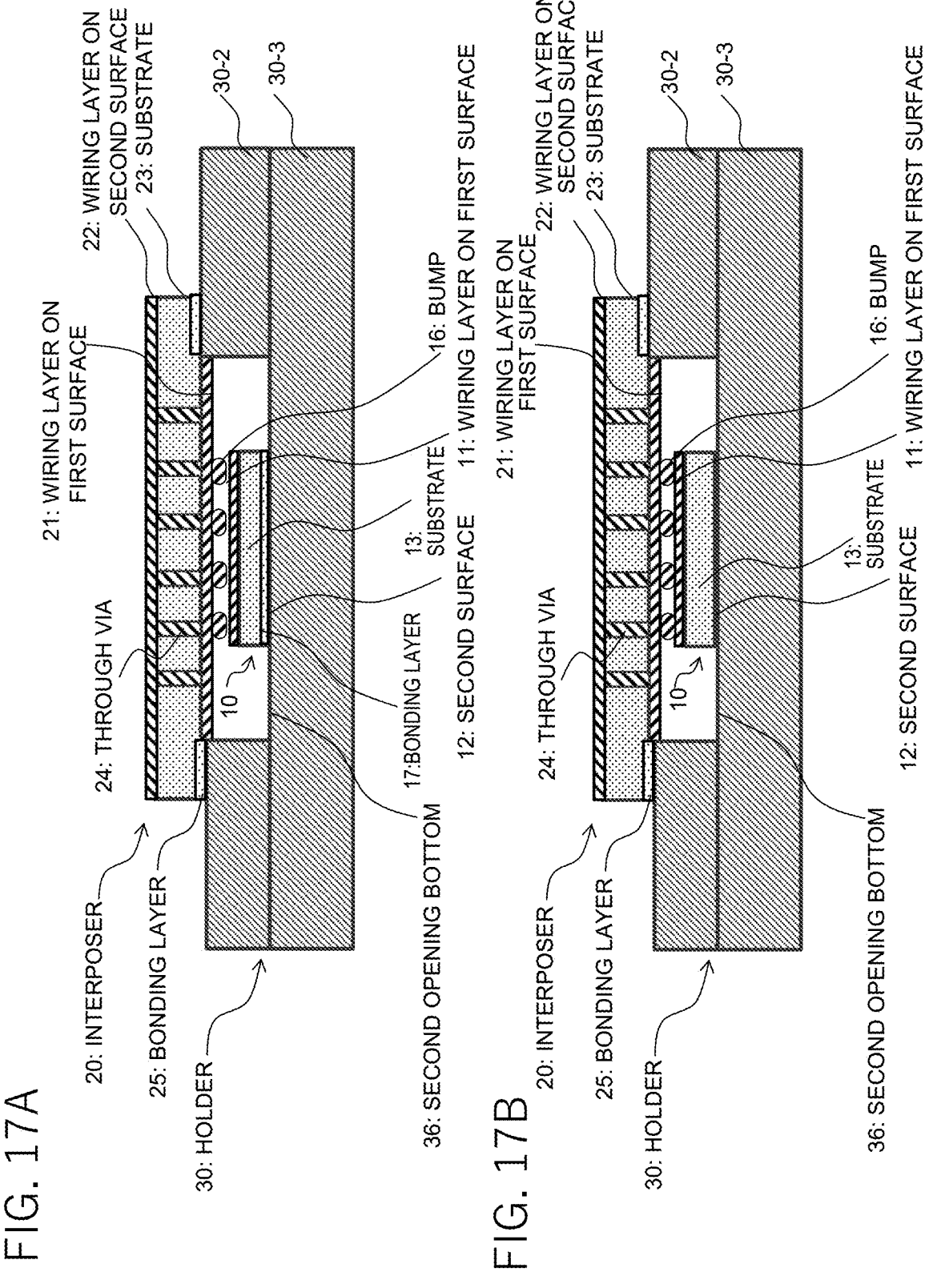
FIG. 17A and FIG. 17B are schematic cross-sectional views illustrating variations of the example of the disclosure.

Referring to FIG. 17A, the second surface 12 of the quantum chip 10 is fixed to the second opening bottom 36 of the holder 30 through the bonding layer 17 by adhesion, bonding or the like. On the other hand, an outer peripheral portion of the first surface of the interposer 20 is adhered to a top surface of the second hollow pedestal 30-2 through an adhesion layer 25. Varnish or grease may be used as the adhesion layer 25.

Referring to FIG. 17B, the second surface 12 of the quantum chip is not adhered to the second opening bottom 36 of the holder 30. On the other hand, the outer peripheral portion of the first surface of the interposer 20 is fixed to the second hollow pedestal 30-2 through the adhesion layer 25 by adhesion, bonding or the like.

Figures 18A, 18B:
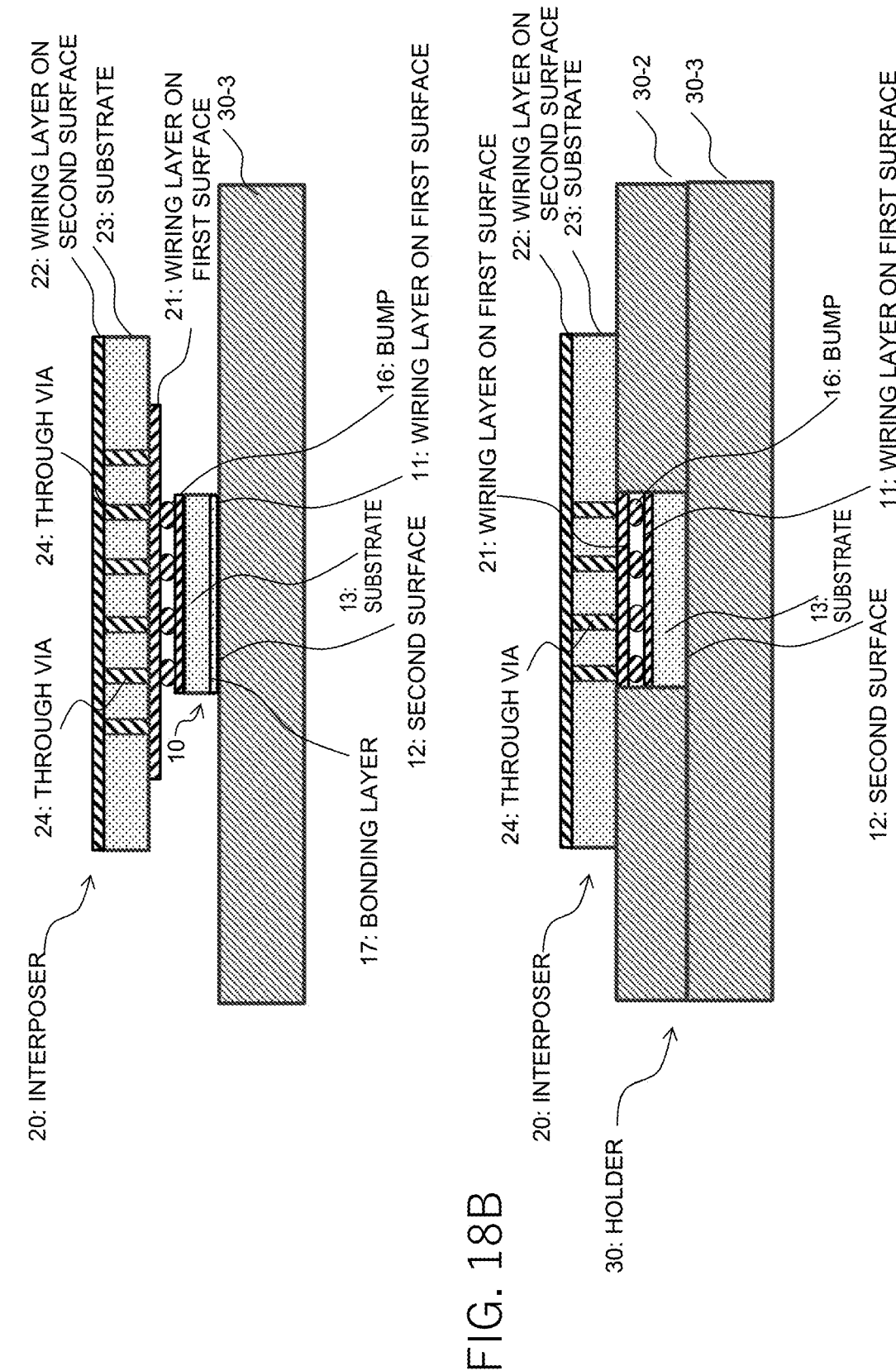
FIG. 18A and FIG. 18B are schematic cross-sectional views illustrating variations of the example of the disclosure.

Referring to FIG. 18A, there are no guides (support members) on the sides of the quantum chip 10 and the interposer 20. In this case, the second surface 12 of the quantum chip 10 may be fixed to the third pedestal 30-3 through the adhesion layer 17 by adhesion, bonding or the like. FIG. 18A corresponds to a configuration illustrated in FIG. 16B without the second hollow pedestal 30-2.

Referring to FIG. 18B, an opening inner wall of the second hollow pedestal 30-2 is in contact with a side surface of the quantum chip 10 and serves as a guide for lateral positioning.

Figures 19A, 19B:
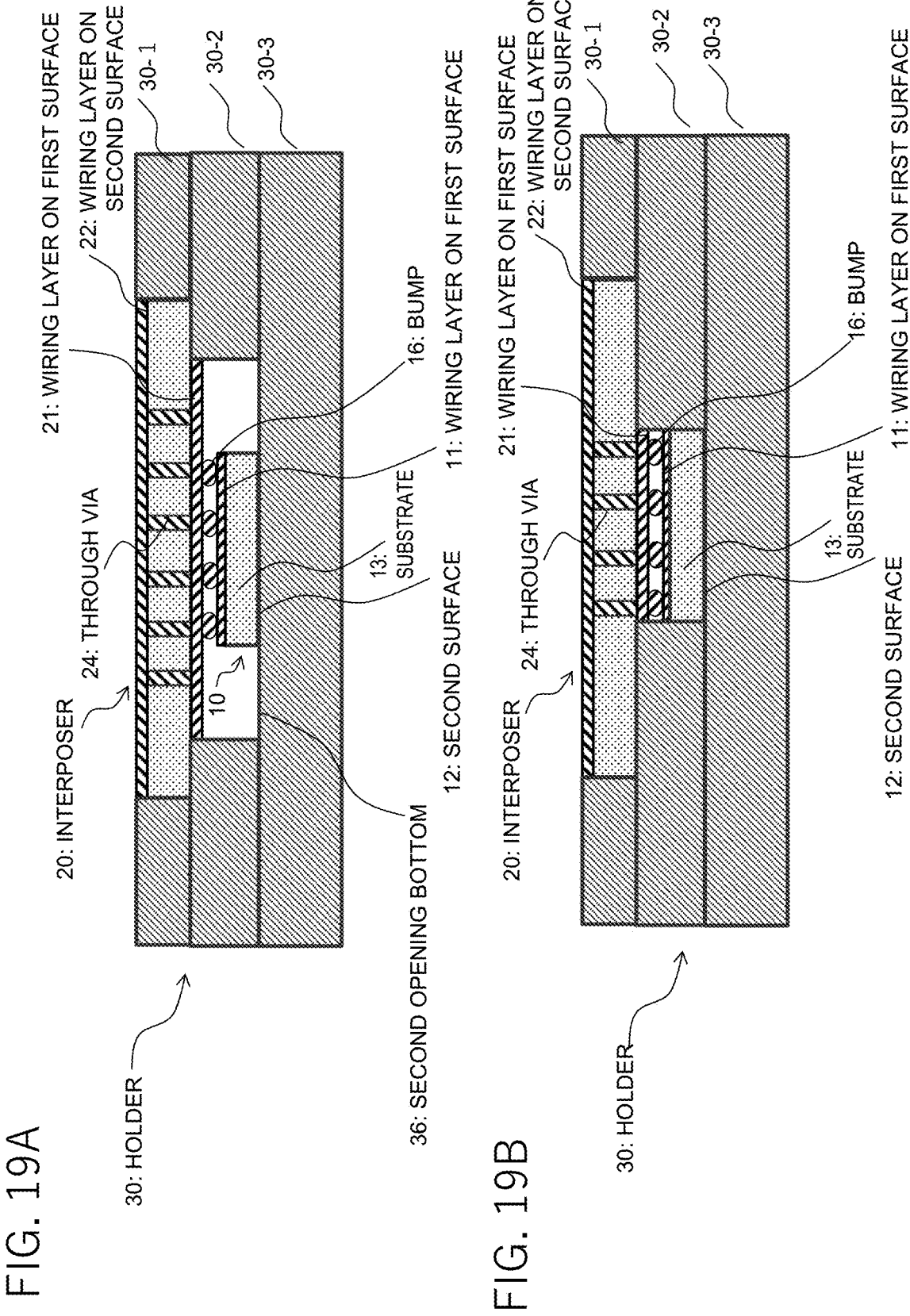
FIG. 19A and FIG. 19B are schematic cross-sectional views illustrating variations of the example of the disclosure.

Referring to FIG. 19A, an opening inner wall of the first hollow pedestal 30-1 is in contact with a side surface of the interposer 20. The first hollow pedestal 30-1 serves as a lateral guide for the interposer 20.

Referring to FIG. 19B, opening inner walls of the first and second hollow pedestals 30-1 and 30-2 are respectively in contact with side surfaces of the interposer 20 and the quantum chip 10 to guide positioning of the interposer 20 and the quantum chip 10. A top surface of the second hollow pedestal 30-2 supports an outer peripheral portion of the first surface of the interposer 20 to facilitate height position control.

Referring to FIG. 20A, a plurality of pillars 18 is respectively inserted into holes opened in the third pedestal 30-3 by a drill, etc., and the second surface 12 of the quantum chip 10 is supported by the plurality of pillars 18. The plurality of pillars 18 contribute to facilitate height position control of the quantum chip 10 and suppress lateral deformation, etc. The plurality of pillars 18 may be made of conductive materials or may be made of insulating materials such as ceramic.

Referring to FIG. 20B, a plurality of pillars 27 is respectively inserted into holes opened in the third pedestal 30-3 by a drill, etc. The plurality of pillars 27 supports the wiring layer 21 on the first surface of the interposer 20 from below. The plurality of pillars 27 contribute to facilitate height position control of the interposer 20 and suppress lateral deformation, etc. The plurality of pillars 27 may be made of conductive materials or may be made of insulating materials such as ceramic.

Figures 21A, 21B:
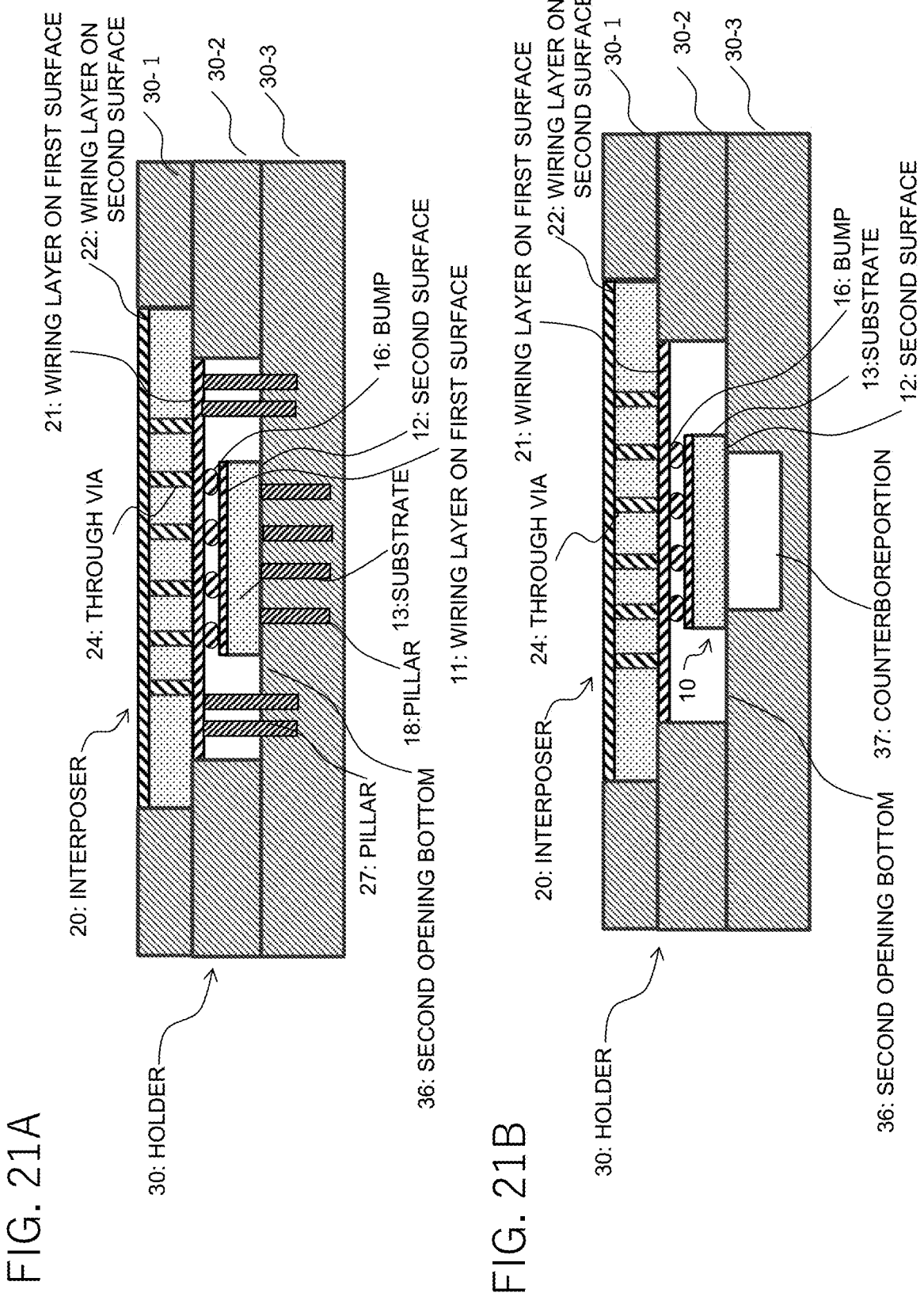
FIG. 21A and FIG. 21B are schematic cross-sectional views illustrating variations of the example of the disclosure.

Referring to FIG. 21A, the plurality of pillars 18 and the plurality of pillars 27 are respectively inserted into holes opened in the third pedestal 30-3 by a drill, etc., the second surface 12 of the quantum chip is supported by the plurality of pillars 18, and the plurality of pillars 27 supports the wiring layer 21 on the first surface of the interposer 20.

Referring to FIG. 21B, a counterbore portion 37 is formed in a central portion of the third pedestal 30-3, an outer peripheral portion of the second surface 12 of the quantum chip 10 is placed around the counterbore portion 37, and a region directly below the outer peripheral portion of the second surface 12 of the quantum chip 10 is a cavity.

Figures 22A, 22B:
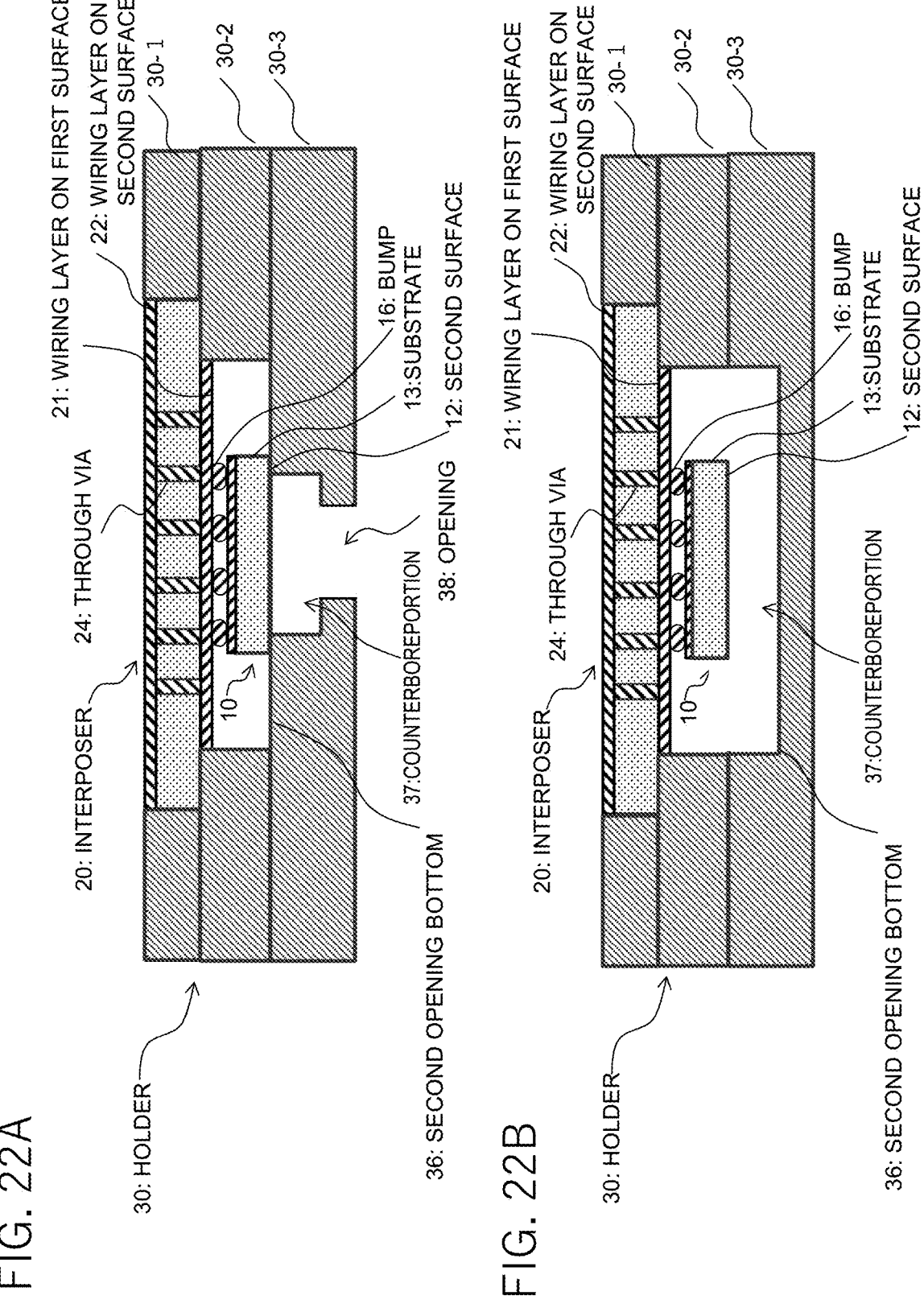
FIG. 22A and FIG. 22B are schematic cross-sectional views illustrating variations of the example of the disclosure.
Figure 24A:
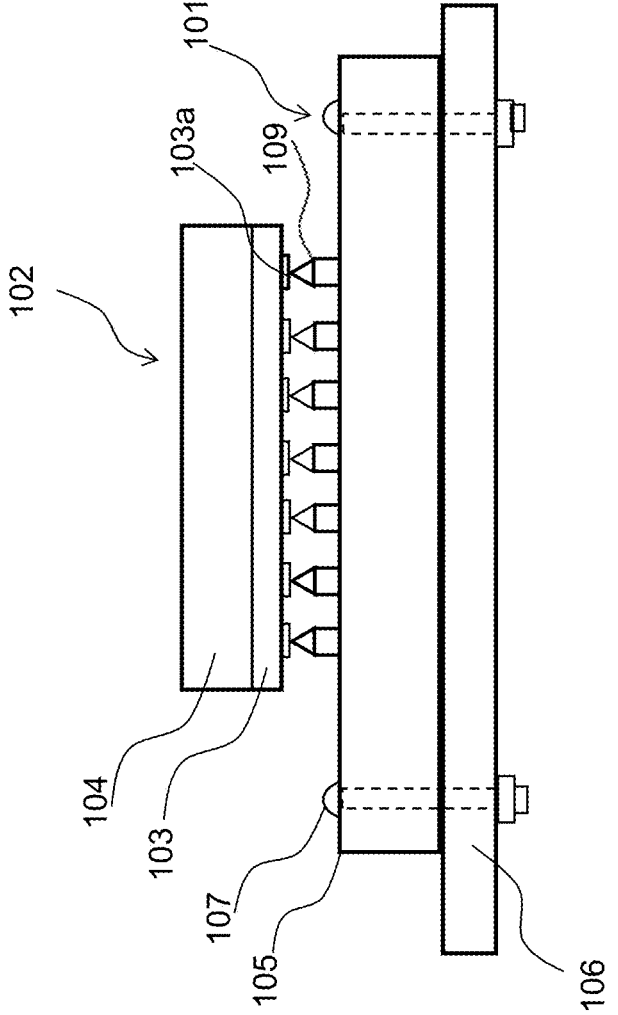
FIG. 24A is a diagram illustrating an electronic apparatus described in PTL 1.
Figure 24B:
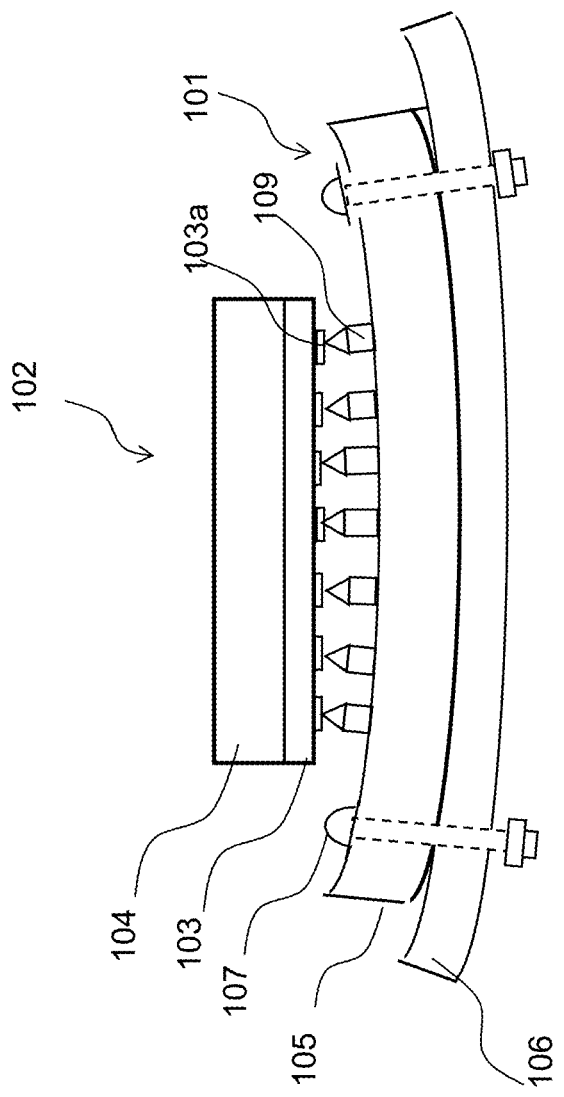
FIG. 24B is a diagram illustrating a deformation in the electronic apparatus illustrated in FIG. 24A.
Figure 24C:
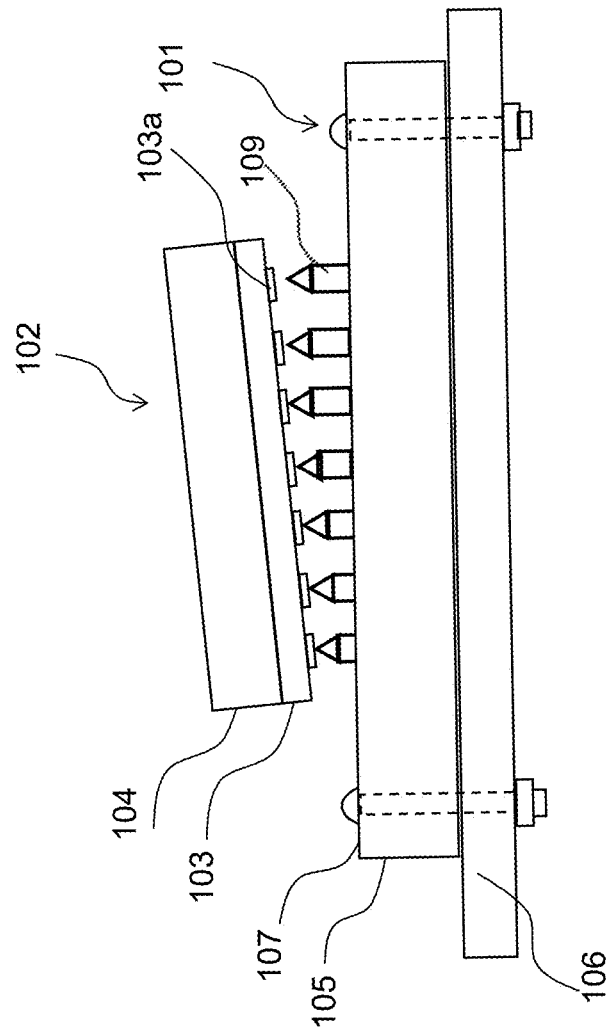
FIG. 24C is a diagram illustrating a deformation in the electronic apparatus illustrated in FIG. 24A.

Referring to FIG. 22A, there is provided an opening 38 penetrating through the third pedestal 30-3 at a bottom of the counterbore portion 37 of the third pedestal 30-3 of FIG. 21B.

Referring to FIG. 22B, planar shapes of the second opening 32 of the second hollow pedestal 30-2 and the counterbore portion 37 are of an identical opening size to form a cavity (counterbore) that houses the quantum chip 10.

Figure 23:
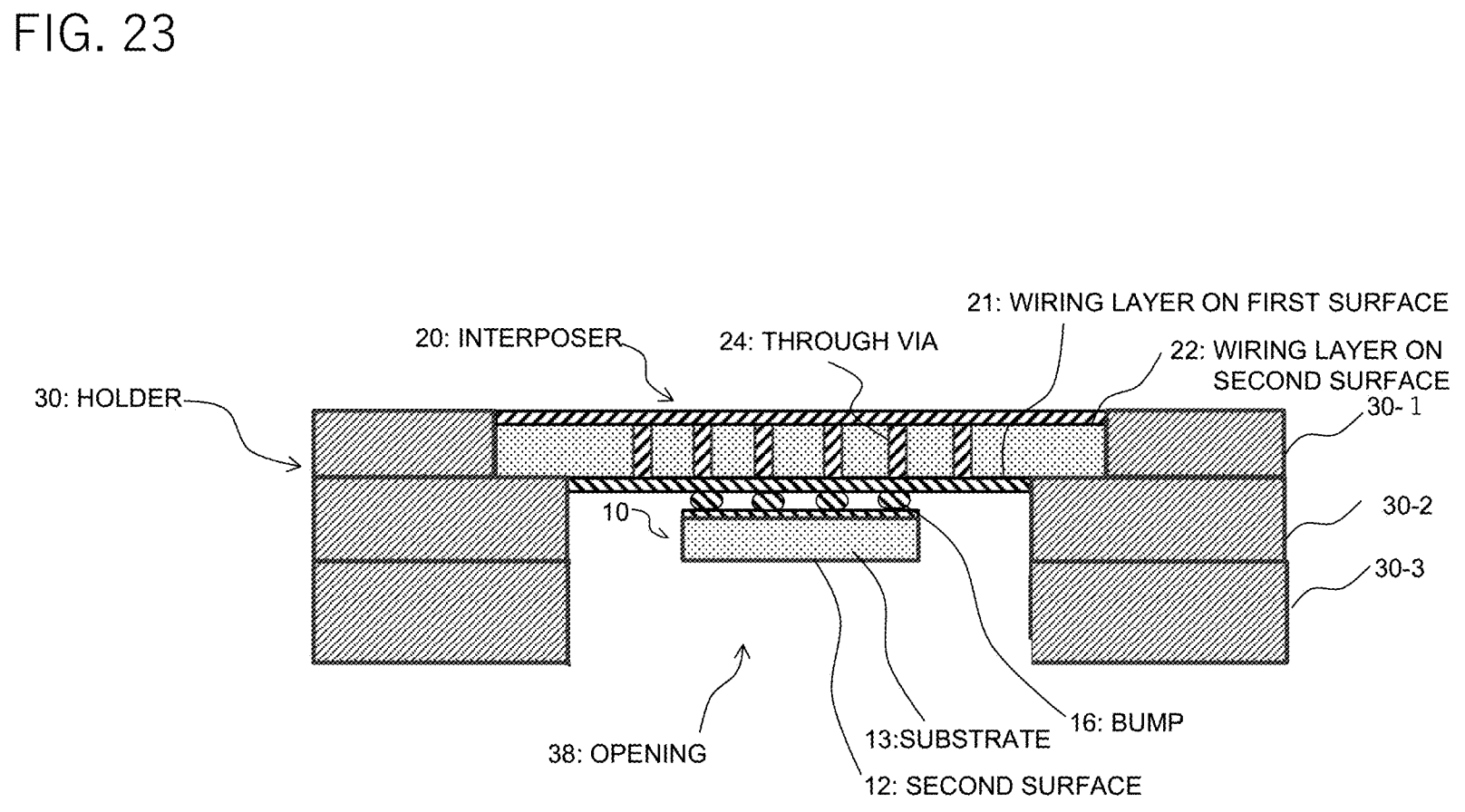

Referring to FIG. 23, the second opening 32 of the second hollow pedestal 30-2 and the opening 38 penetrating through the third pedestal 30-3 are of an identical opening size to form a cavity (counterbore) that houses the quantum chip 10.

For each variation described with reference to FIG. 19A to FIG. 23, any of configurations described with reference to FIG. 6 to FIG. 15 (e.g., the side walls 61, 61A, 61B, or 64, the support members 62A through 62C, 63, or 66) may, as a matter of course, be combined in any desired manner.

According to the above examples and various variations of the disclosure, the space between the socket 40 and the interposer 20 can be kept constant and tilting of the socket 40 can be suppressed.

It is also possible to ensure impedance matching when the probe pin(s) 44 and the terminal(s) (signal terminal(s)) of the wiring layer 22 on the second surface of the interposer 20 are electrically connected.

In addition, the configuration in which the spacer(s) 47 is/are in contact with the wiring layer 22 on the second surface of the interposer 20, can contribute to improve cooling effect around the socket 40.

With a barycentric position (gravity center) of an arrangement of the probe pins 44 coincident with a barycentric position of an arrangement of the at least one spacer 47 on a surface of the socket 40 facing the interposer 20, the spacers 47 are uniformly loaded when the socket 40 is mounted on the interposer 20, which can contribute to ensure positional stability along a height direction of the socket 40.

The above examples of the disclosure can partially or entirely be described as following Supplementary notes (Notes), though not limited thereto.

(Note 1) A quantum device, including:

a quantum chip including a superconducting quantum circuit;

an interposer including:

a substrate;

a first wiring layer on a first surface of the substrate, with the quantum chip mounted thereon; and a second wiring layer on a second surface of the substrate opposite to the first surface;

a housing including:

a plurality of openings penetrating through the housing from a first surface of the housing to a second surface opposite the first surface of the housing, the first surface of the housing opposing the second surface of the interposer; and a plurality of probe pins respectively housed in the plurality of openings, a first end of each of the plurality of probe pins in contact with a corresponding terminal of a plurality of terminals provided on the second wiring layer of the interposer;

a board including:

a wiring layer on a first surface of the board faced to the second surface of the housing, the wiring layer of the board including a plurality of terminals, each in contact with a second end of a corresponding one of the plurality of probe pins housed respectively in the plurality of openings in the housing; and one or more connectors, each arranged on a second surface opposite to the first surface of the board for connection of a signal to and/or from an outside, and one or more spacers between the first surface of the housing and the second surface of the interposer to ensure a clearance between the first surface of the housing and the second surface of the interposer opposing the first surface of the housing.

(Note 2) The quantum device described in Note 1, wherein the housing includes at least one spacer disposed protruding from the first surface of the housing side of the housing to the second surface side of the interposer.

(Note 3) The quantum device described in Note 1 or 2, wherein the spacer is made of conductive materials or dielectric materials.

(Note 4) The quantum device described in any one of Notes 1 to 3, wherein the spacer is integrally formed with the housing.

(Note 5) The quantum device described in any one of Notes 1 to 4, wherein a barycentric position (gravity center) of the spacer (s) coincides with a barycentric position of the plurality of probe pins, on the first surface of the housing.

(Note 6) The quantum device described in any one of Notes 1 to 5, including a positioning pin that protrudes from the second surface of the housing and fits in an opening on the first surface of the board side of the board.

(Note 7) The quantum device described in any one of Notes 1 to 5, further including a holder including:

a first hollow pedestal that has a first opening;

a second hollow pedestal with the first hollow pedestal placed thereon, and with a second opening smaller than the first opening; and a third pedestal with the second hollow pedestal placed thereon, wherein the quantum chip is housed in the second opening and the interposer is housed in the first opening.

(Note 8) The quantum device described in Note 7, including, on an outer periphery surface of the first hollow pedestal, any one of the following:

(a) a side wall that surrounds a side surface of the housing, spaced apart from the side surface of the housing, an outer edge of the first surface of the board placed on a top surface the side wall;

(b) a side wall with a height thereof less than or equal to that of the housing, the side wall in contact with the side surface of the housing:

(c) a side wall in contact with the side surface of the housing, an outer edge of the first surface of the board placed on a top surface the side wall;

(d) a support member that supports an outer edge of the first surface of the board from below;

(e) a support member with a height thereof less than or equal to that of the spacer, a side surface of the support member in contact with a part of a side surface of the spacer:

(f) a support member supporting an outer edge of the first surface of the housing from below, a side surface of the support member in contact with a side surface of the spacer:

(g) a first support member and a second support member, the first support member supporting an outer edge of the first surface of the housing from below, a side surface of the first support member in contact with a side surface of the spacer, the second support member with a height less than or equal to that of the housing, a side surface of the second support member in contact with a side surface of the housing;

(h) a first side wall and a second side wall, the first side wall surrounding a side surface of the housing spaced apart from the side surface of the housing with an outer edge of the first surface of the board being placed on a top surface of the first side wall, the second side wall surrounding side surfaces of the first side wall, the first and second hollow pedestals and the third pedestal;

(i) a first side wall and a second side wall, the first side wall surrounding a side surface of the housing spaced apart from the side surface of the housing with an outer edge of the first surface of the board being placed on a top surface of the first side wall, the second side wall surrounding side surfaces of the board, the first side wall, the first and second hollow pedestals and the third pedestal; and (j) a first side wall, a second side wall and a support member, the first side wall surrounding a side surface of the housing spaced apart from the side surface of the housing with an outer edge of the first surface of the board being placed on a top surface of the first side wall, the second side wall surrounding side surfaces of the first and second hollow pedestals and the third pedestal and outer circumferences of sides of the first side wall and the board, the support member disposed on the first side wall and pressing an outer edge of a second surface of the board from above, the second surface opposite to the first surface of the board; and (k) at least one of the one or more spaces including a flat portion and a protruding portion protruded from the flat portion, a side surface of the protruding portion made in contact with an edge portion of a side surface of the interposer, the flat portion in contact with an edge portion of the second surface of the interposer.

(Note 9) The quantum device described in Note 7 or 8, wherein the quantum chip is mounded on the first wiring layer on the first surface of the interposer with a first surface thereof including the superconducting quantum circuit faced to the first wiring layer of the interposed, in a manner including any one of the following:

(a) in which a second surface of the quantum chip opposite to the first surface thereof is in contact with the third pedestal that forms a bottom of the second opening of the second hollow pedestal;

(b) in which a second surface of the quantum chip is adhered to the third pedestal that forms a bottom of the second opening of the second hollow pedestal;

(c) in which an outer edge of the first surface of the interposer is adhered to a surface of the second hollow pedestal;

(d) in which an inner wall of the second opening of the second hollow pedestal is in contact with a side surface of the quantum chip;

(e) in which a plurality of pillars embedded in the third pedestal that forms a bottom of the second opening of the second hollow pedestal to support the second surface of the quantum chip;

(d) in which a plurality of pillars, embedded in the third pedestal that forms a bottom of the second opening of the second hollow pedestal and protruded to support the first surface of the interposer;

(e) in which a first pillar and a second pillar are provided, the first pillar being embedded in the third pedestal that forms a bottom of the second opening of the second hollow pedestal and supporting the second surface of the quantum chip, the second pillar being embedded in the third pedestal that forms a bottom of the second opening and supporting the first surface of the interposer;

(f) in which the third pedestal that forms a bottom of the second opening of the second hollow pedestal includes a counterbore in at least a portion of a region directly below the quantum chip;

(g) in which the third pedestal that forms a bottom of the second opening of the second hollow pedestal includes an opening penetrating through the third pedestal in at least a portion of a region directly below the quantum chip;

(h) in which the third pedestal includes a bottomed third opening of a same size as the second opening that houses the quantum chip; and (i) in which the third pedestal includes a third opening with a same size as the second opening that houses the quantum chip, the third opening penetrating through the third pedestal.

(Note 10) The quantum device described in any one of Notes 1 to 9, wherein as the one or more spacers on the first surface of the housing, provided is any one of the following:

(a) a single spacer arranged at a barycentric position of the plurality of probe pins;

(b) a plurality of spacers arranged around an arrangement region of the plurality of probe pins;

(c) a spacer of a closed loop type surrounding an arrangement region of the plurality of probe pins;

(d) a spacer of a closed loop type with a notch disposed at least one location, surrounding an arrangement region of the plurality of probe pins; and (e) a spacer including at least two straight lines extending in predetermined directions in an arrangement region of the plurality of probe pins, respectively, and intersecting at a center of the arrangement region of the plurality of probe pins.

The disclosure of each of PTL 1 and 2 is incorporated herein by reference thereto. Variations and adjustments of the example embodiments and examples are possible within the scope of the overall disclosure (including the claims) of the present invention and based on the basic technical concept of the present invention. Various combinations and selections of various disclosed elements (including the elements in each of the claims, examples, drawings, etc.) are possible within the scope of the claims of the present invention. Namely, the present invention of course includes various variations and modifications that could be made by those skilled in the art according to the overall disclosure including the claims and the technical concept.

What is claimed is:

1. A quantum device comprising:

a quantum chip including a superconducting quantum circuit;

an interposer including:

a substrate;

a first wiring layer on a first surface of the substrate with the quantum chip mounted thereon; and a second wiring layer on a second surface of the substrate opposite to the first surface;

a housing including:

a plurality of openings penetrating through the housing from a first surface of the housing to a second surface opposite the first surface of the housing, the first surface of the housing opposing the second surface of the interposer; and a plurality of probe pins respectively housed in the plurality of openings, a first end of each of the plurality of probe pins in contact with a corresponding one of a plurality of terminals provided on the second wiring layer of the interposer;

a board including a wiring layer on a first surface of the board faced to the second surface of the housing, the wiring layer on the first surface of the board including a plurality of terminals, each in contact with a second end of a corresponding one of the plurality of probe pins housed respectively in the plurality of openings in the housing, and one or more spacers between the first surface of the housing and the second surface of the interposer to ensure a clearance between the first surface of the housing and the second surface of the interposer opposing the first surface of the housing.

2. The quantum device according to claim 1, wherein the housing includes the one or more spacers, each disposed protruding from the first surface side of the housing to the second surface side of the interposer.

3. The quantum device according to claim 1, wherein the spacer includes an electrically conductive material and/or an electrically insulating material.

4. The quantum device according to claim 1, wherein the housing includes the one or more spacers integrally formed with the housing.

5. The quantum device according to claim 1, wherein the one or more spacers are configured to have a barycentric position thereof in the first surface of the housing coincident with a barycentric position of the plurality of probe pins.

6. The quantum device according to claim 1, further comprising a positioning pin protruding from the second surface of the housing, the positioning pin fitted in a hole formed on the first surface of the board.

7. The quantum device according to claim 1, further comprising a holder that includes:

a first hollow pedestal with a first opening;

a second hollow pedestal with a second opening of a size smaller than that of the first opening, the first hollow pedestal placed on the second hollow pedestal with the second opening communicating with the first opening; and a third pedestal with the second hollow pedestal placed thereon, wherein the quantum chip is housed in the second opening, and the interposer is housed in the first opening.

8. The quantum device according to claim 7, comprising, on an outer periphery surface of the first hollow pedestal, any one of the following:

(a) a side wall that surrounds a side surface of the housing, spaced apart from the side surface of the housing, an outer edge of the first surface of the board placed on a top surface the side wall;

(b) a side wall with a height thereof less than or equal to that of the housing, the side wall in contact with the side surface of the housing:

(c) a side wall in contact with the side surface of the housing, an outer edge of the first surface of the board placed on a top surface the side wall;

(d) a support member that supports an outer edge of the first surface of the board from below;

(e) a support member with a height thereof less than or equal to that of the spacer, a side surface of the support member in contact with a part of a side surface of the spacer:

(f) a support member supporting an outer edge of the first surface of the housing from below, a side surface of the support member in contact with a side surface of the spacer:

(g) a first support member and a second support member, the first support member supporting an outer edge of the first surface of the housing from below, a side surface of the first support member in contact with a side surface of the spacer, the second support member with a height less than or equal to that of the housing, a side surface of the second support member in contact with a side surface of the housing;

(h) a first side wall and a second side wall, the first side wall surrounding a side surface of the housing spaced apart from the side surface of the housing with an outer edge of the first surface of the board being placed on a top surface of the first side wall, the second side wall surrounding side surfaces of the first side wall, the first and second hollow pedestals and the third pedestal;

(i) a first side wall and a second side wall, the first side wall surrounding a side surface of the housing spaced apart from the side surface of the housing with an outer edge of the first surface of the board being placed on a top surface of the first side wall, the second side wall surrounding side surfaces of the board, the first side wall, the first and second hollow pedestals and the third pedestal; and (j) a first side wall, a second side wall and a support member, the first side wall surrounding a side surface of the housing spaced apart from the side surface of the housing with an outer edge of the first surface of the board being placed on a top surface of the first side wall, the second side wall surrounding side surfaces of the first and second hollow pedestals and the third pedestal and outer circumferences of sides of the first side wall and the board, the support member disposed on the first side wall and pressing an outer edge of the second surface of the board from above.

9. The quantum device according to claim 7, wherein at least one of the one or more spaces includes a flat portion and a protruding portion protruded from the flat portion, a side surface of the protruding portion made in contact with an edge portion of a side surface of the interposer, the flat portion in contact with an edge portion of the second surface of the interposer.

10. The quantum device according to claim 7, wherein the quantum chip is mounded on the first wiring layer on the first surface of the interposer with a first surface thereof including the superconducting quantum circuit faced to the first wiring layer of the interposed, in a manner including any one of the following:

(a) in which a second surface of the quantum chip opposite to the first surface thereof is in contact with the third pedestal that forms a bottom of the second opening of the second hollow pedestal;

(b) in which a second surface of the quantum chip is adhered to the third pedestal that forms a bottom of the second opening of the second hollow pedestal;

(c) in which an outer edge of the first surface of the interposer is adhered to a surface of the second hollow pedestal;

(d) in which an inner wall of the second opening of the second hollow pedestal is in contact with a side surface of the quantum chip;

(e) in which a plurality of pillars embedded in the third pedestal that forms a bottom of the second opening of the second hollow pedestal to support the second surface of the quantum chip;

(d) in which a plurality of pillars, embedded in the third pedestal that forms a bottom of the second opening of the second hollow pedestal and protruded to support the first surface of the interposer;

(e) in which a first pillar and a second pillar are provided, the first pillar being embedded in the third pedestal that forms a bottom of the second opening of the second hollow pedestal and supporting the second surface of the quantum chip, the second pillar being embedded in the third pedestal that forms a bottom of the second opening and supporting the first surface of the interposer;

(f) in which the third pedestal that forms a bottom of the second opening of the second hollow pedestal includes a counterbore in at least a portion of a region directly below the quantum chip;

(g) in which the third pedestal that forms a bottom of the second opening of the second hollow pedestal includes an opening penetrating through the third pedestal in at least a portion of a region directly below the quantum chip;

(h) in which the third pedestal includes a bottomed third opening of a same size as the second opening that houses the quantum chip; and (i) in which the third pedestal includes a third opening with a same size as the second opening that houses the quantum chip, the third opening penetrating through the third pedestal.

11. The quantum device according to claim 1, wherein as the one or more spacers on the first surface of the housing, provided is any one of the following:

(a) a single spacer arranged at a barycentric position of the plurality of probe pins;

(b) a plurality of spacers arranged around an arrangement region of the plurality of probe pins;

(c) a spacer of a closed loop type surrounding an arrangement region of the plurality of probe pins;

(d) a spacer of a closed loop type with a notch disposed at least one location, surrounding an arrangement region of the plurality of probe pins; and (e) a spacer including at least two straight lines extending in predetermined directions in an arrangement region of the plurality of probe pins, respectively, and intersecting at a center of the arrangement region of the plurality of probe pins.

12. The quantum device according to claim 1, wherein the board includes:

at least one connector arranged on a second surface opposite to the first surface of the board, for connection of a signal to and/or from an outside; and at least one through via penetrating from the first surfaces of the board to the second surface of the board to electrically connect the terminal on the first surface of the board to the connector on the second surface of the board.

13. The quantum device according to claim 3, wherein the spacer includes, as the electrically insulating material, plastics and/or ceramics.

14. The quantum device according to claim 3, wherein the spacer includes, as the electrically conductive material, a normal conductor or a superconductor.

15. The quantum device according to claim 1, wherein the spacer and the housing are separate units.

\* \* \* \* \*